United States Patent
Kim

(10) Patent No.: US 12,224,013 B2
(45) Date of Patent: Feb. 11, 2025

(54) SEMICONDUCTOR MEMORY DEVICE

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 106 days.

(21) Appl. No.: 18/183,008

(22) Filed: Mar. 13, 2023

(65) Prior Publication Data

US 2024/0096421 A1 Mar. 21, 2024

(30) Foreign Application Priority Data

Sep. 15, 2022 (KR) .................. 10-2022-0116545

(51) Int. Cl.
G11C 16/24 (2006.01)
G11C 16/08 (2006.01)
G11C 16/10 (2006.01)
G11C 16/26 (2006.01)

(52) U.S. Cl.
CPC ............ *G11C 16/102* (2013.01); *G11C 16/08* (2013.01); *G11C 16/26* (2013.01)

(58) Field of Classification Search
CPC ....................................... G11C 16/24
USPC ....................................... 365/185.12
See application file for complete search history.

(56) References Cited

U.S. PATENT DOCUMENTS

| | | | |
|---|---|---|---|
| 10,832,786 B2 | 11/2020 | Maejima | |
| 2016/0093384 A1* | 3/2016 | Lee | G11C 16/24 |
| | | | 365/185.12 |
| 2016/0315097 A1 | 10/2016 | Hsu | |

* cited by examiner

*Primary Examiner* — Jason Lappas
(74) *Attorney, Agent, or Firm* — WILLIAM PARK & ASSOCIATES LTD.

(57) ABSTRACT

A semiconductor memory device includes a channel layer coupled to a bit line, a cell string located along a first side portion of the channel layer, and an auxiliary string located along a second side portion of the same channel layer.

17 Claims, 23 Drawing Sheets

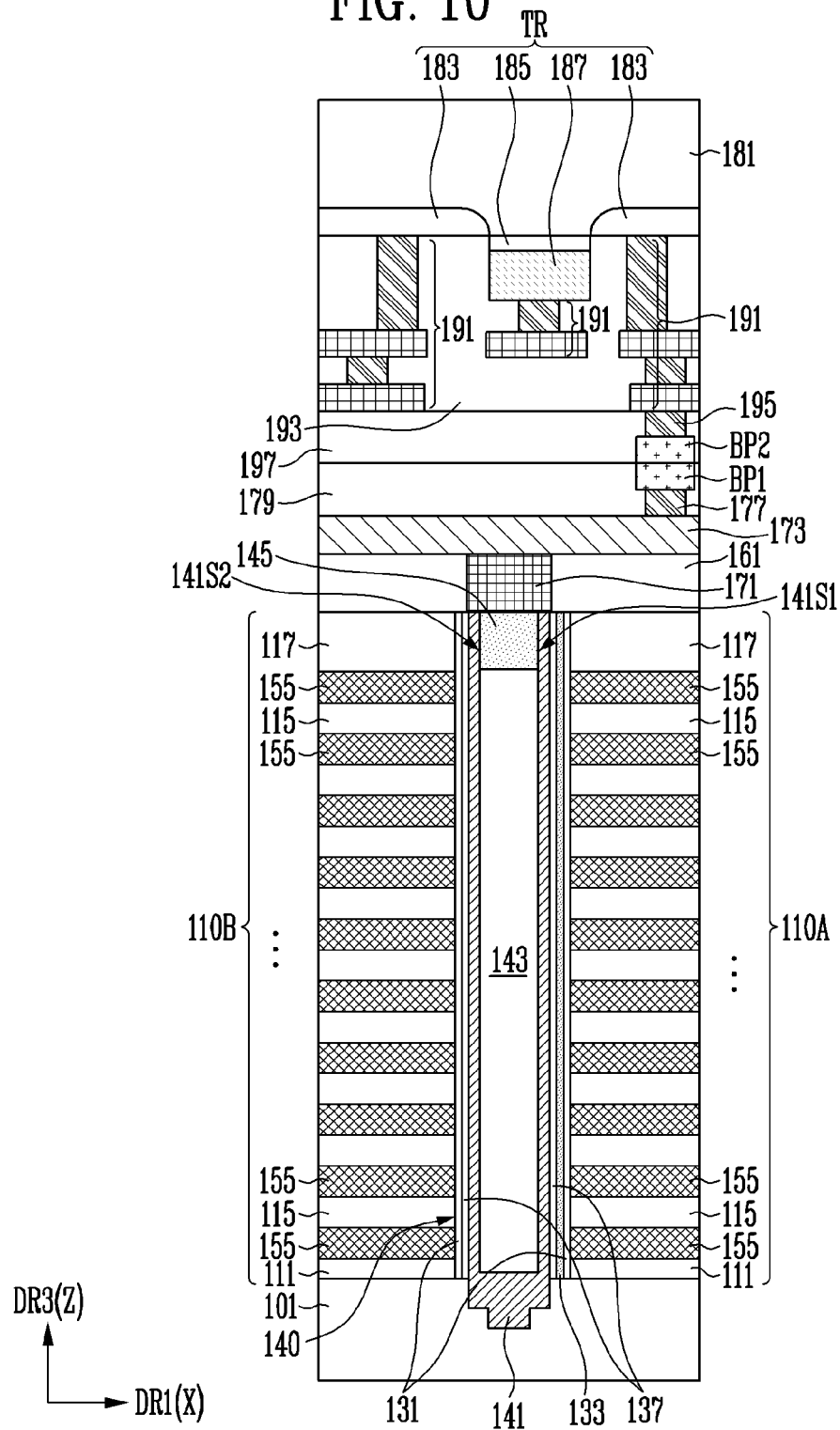

SEMICONDUCTOR MEMORY DEVICE

CROSS-REFERENCE TO RELATED APPLICATION

The present application claims priority under 35 U.S.C. § 119(a) to Korean patent application number 10-2022-0116545, filed on Sep. 15, 2022, in the Korean Intellectual Property Office, the entire disclosure of which is incorporated herein by reference.

BACKGROUND

1. Technical Field

Various embodiments of the present disclosure relate to a semiconductor memory device, and more particularly to a nonvolatile memory device.

2. Related Art

A semiconductor memory device may include a plurality of memory cells capable of storing data. A nonvolatile memory device, which is a kind of semiconductor memory device, may retain stored data even when power supplied to the memory device is interrupted. Examples of a nonvolatile memory device include a read only memory, (ROM), a programmable ROM (PROM), electrically programmable ROM (EPROM), electrically erasable and programmable ROM (EEPROM), a flash memory (RAM), resistive random access memory (RRAM), a phase-change RAM (PRAM), a magnetic RAM (MRAM), a ferroelectric RAM (FRAM), etc.

Non-volatile memory devices have changed from a two dimensional (2D) structure to a three-dimensional (3D) structure. A memory cell array with a 3D structure comprises a plurality of memory cells stacked on a substrate, the integration of which may be higher than integration of a memory cell array having a 2D structure. Due to the structural change of a 3D memory cell array, the operational reliability of a corresponding semiconductor memory device may deteriorate.

SUMMARY

An embodiment of the present disclosure may provide for a semiconductor memory device. The semiconductor memory device may include a memory cell array comprising a cell string and an auxiliary string, which are coupled to each other through a channel layer that is coupled to a bit line, wherein the cell string comprises a plurality of memory cells stacked along a first side portion of the channel layer and wherein the auxiliary string comprises a plurality of auxiliary transistors stacked along a second side portion of the channel layer, and, a voltage supply circuit configured to apply a first pass voltage to an unselected auxiliary word line among a plurality of auxiliary word lines coupled to the plurality of auxiliary transistors. The voltage supply circuit is additionally configured to apply a first voltage, which is less than the first pass voltage, to an unselected word line among the plurality of word lines coupled to the plurality of memory cells while applying a program voltage or a read voltage to the selected word line among the plurality of word lines.

An embodiment of the present disclosure may provide for a semiconductor memory device. The semiconductor memory device may include a channel layer including a first side portion and a second side portion surfaces of which face different directions, a gate stacked body enclosing the first side portion of the channel layer, an auxiliary gate stacked body enclosing the second side portion of the channel layer, and a data storage layer disposed between the first side portion of the channel layer and the gate stacked body, the data storage layer being formed such that the second side portion of the channel layer is opened.

BRIEF DESCRIPTION OF THE DRAWINGS

FIGS. 9 and 10 are sectional views of a semiconductor memory device according to embodiments of the present disclosure.

DETAILED DESCRIPTION

The specific structural and functional descriptions disclosed herein are merely illustrative and serve to describe exemples or embodiments of the present disclosure. The embodiments disclosed herein can of course be modified in various forms and replaced with other equivalent embodiments. The present disclosure should therefore not be construed as being limited to embodiments described or set forth herein.

It should be understood that, terms like "first," "second," et al., may be used herein to describe various elements, elements described with or by such terms should not be limited by those terms. Such terms are only used to distinguish one element from another element; the order or number of components is not limited by them.

Various embodiments of the present disclosure are directed to a semiconductor memory device having improved operational reliability.

Figure 1:
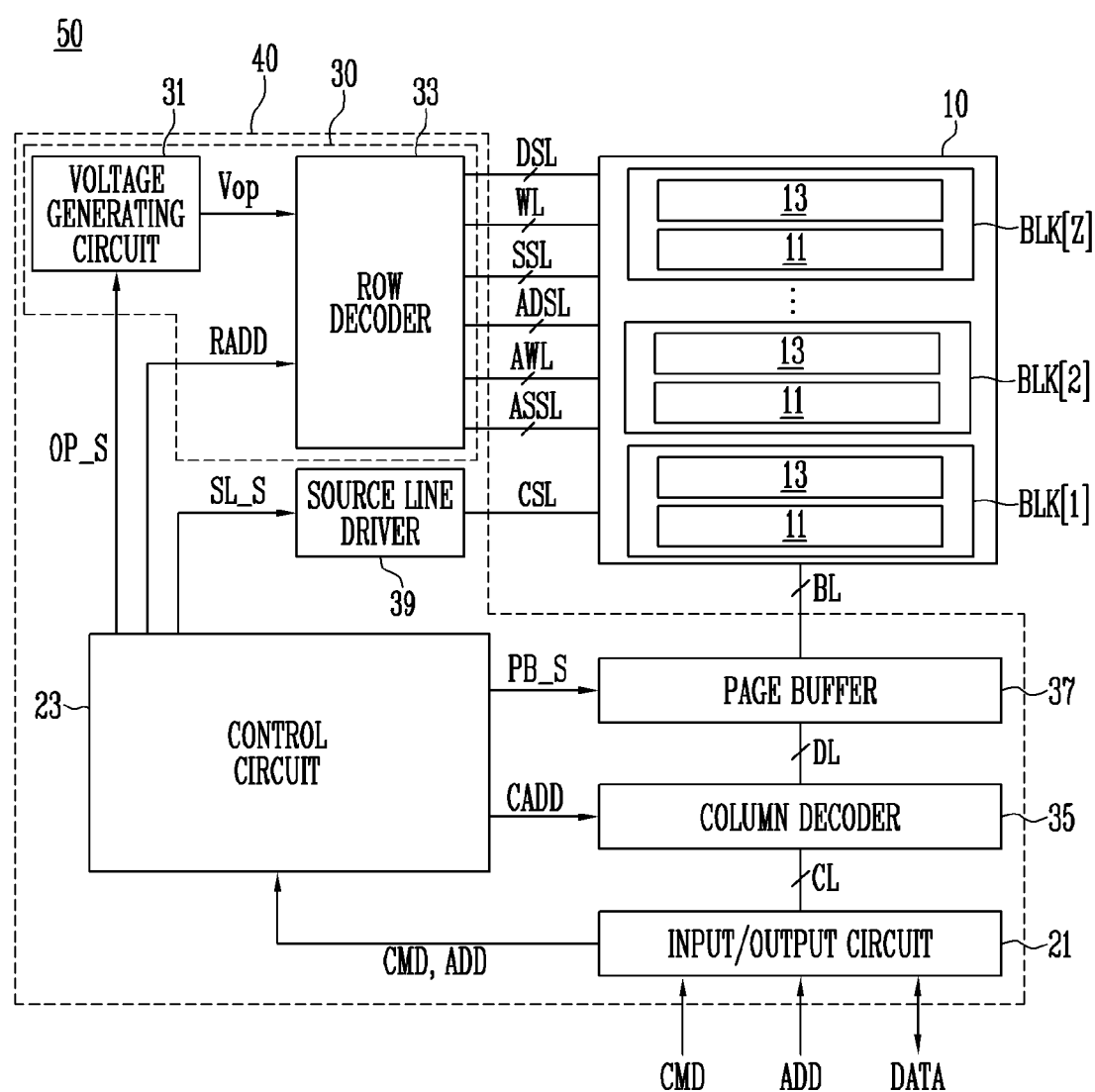
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, a semiconductor memory device 50 may include a peripheral circuit 40 and a memory cell array 10.

The memory cell array 10 may include a plurality of memory blocks BLK[1] to BLK[Z] (where Z is an integer equal to or greater than 2). Each memory block may include a cell string array 11 and an auxiliary string array 13. The cell string array 11 may include a plurality of memory cells. The auxiliary string array 13 may include a plurality of auxiliary transistors. The memory cell array 10 may be coupled to a peripheral circuit 40 through several separate conductors, namely, a common source line CSL, a plurality of bit lines BL, a plurality of drain select lines DSL, a plurality of word lines WL, a plurality of source select lines SSL, a plurality of auxiliary drain select lines ADSL, a plurality of auxiliary word lines AWL, and a plurality of auxiliary source select lines ASSL.

The peripheral circuit 40 may perform different operations on the memory cell array 10, namely, an erase operation, a program operation, or a read operation on the memory cells. In an embodiment, the peripheral circuit 40 may include an input/output circuit 21, a control circuit 23, a voltage supply circuit 30, a column decoder 35, a page buffer 37, and a source line driver 39.

The input/output circuit 21 may receive a command CMD and an address ADD, from a device (e.g., a memory controller) that is external to or not part of the semiconductor memory device 50, and provide or transfer the received command and address to the control circuit 23. The input/output circuit 21 may also exchange data DATA between the aforementioned external device and the column decoder 35.

The control circuit 23 may output an operation command signal OP_S, a row address RADD, a source line control signal SL_S, a page buffer control signal PB_S, and a column address CADD, in response to the control circuit's receipt of the command CMD and the address ADD from the input/output circuit 21. In an embodiment, the control circuit 23 may control the semiconductor memory device 50 to perform an erase operation, a program operation, or a read operation, in response to an erase command, a program command, or a read command received by the control circuit 23 from the input/output circuit 21.

The voltage supply circuit 30 may generate operating voltages Vop required for an erase operation, a program operation, or a read operation and supply the generated operating voltages Vop to a drain select line DSL, a word line WL, a source select line SSL, an auxiliary drain select line ADSL, an auxiliary word line AWL, and an auxiliary source select line ASSL of a selected memory block, in response to signals that the voltage supply circuit 30 receives from the control circuit 23. As shown in FIG. 1, the voltage supply circuit 30 may include a voltage generating circuit 31 and a row decoder 33.

The voltage generating circuit 31 may generate various operating voltages Vop required by an erase operation, a program operation, or a read operation. The operating voltages Vop are generated responsive to receipt of the operation command signal OP_S. The voltage generating circuit 31 may transmit various operating voltages Vop to the row decoder 33 in response to the operation command signal OP_S.

The row decoder 33 may transfer the operating voltages Vop to the drain select line DSL, the word line WL, the source select line SSL, the auxiliary drain select line ADSL, the auxiliary word line AWL, and the auxiliary source select line ASSL of the selected memory block in response to the row address RADD.

During an erase operation, an erase word line voltage (e.g., a ground or reference voltage, usually zero volts, but which could instead be a positive or negative, non-zero reference potential voltage) generated by the voltage generating circuit 31 may be transmitted to the word lines of the memory block that is selected by the row decoder 33, depending on the row address RADD. The erase operation may be performed or controlled on a memory block basis. In this case, memory cells included in the same memory block may be simultaneously erased. In an embodiment, each memory block may be divided into sub-blocks, by which the erase operation may be controlled on a sub-block basis. In this case, memory cells included in the same sub-block may be simultaneously erased.

During a program operation, a program voltage, a first voltage, a second voltage, pass voltages corresponding to a turn-on voltage (e.g., a first pass voltage, a second pass voltage. etc.) which are generated by the voltage generating circuit 31, may be transmitted or provided to the word lines and the auxiliary word lines of the memory block selected by the row decoder 33, depending on the row address RADD. The cell string array 11 of each memory block may be divided into a plurality of physical pages. Each physical page may include a plurality of memory cells coupled to the same word line. A program operation may be controlled on a physical page basis.

During a read operation or a program verify operation, a read voltage, a program verify voltage, pass voltages corresponding to a turn-on voltage (e.g., a first pass voltage and a second pass voltage), a first voltage, a second voltage, an equalizing voltage, etc., which are generated by the voltage generating circuit 31, may be transmitted to the word lines and the auxiliary word lines of the memory block selected by the row decoder 33 depending on the row address RADD.

The column decoder 35 may transmit the data DATA, received from the input/output circuit 21, to the page buffer 37 or transmit the data DATA, stored in the page buffer 37, to the input/output circuit 21 in response to the column address CADD. The column decoder 35 may exchange data DATA with the input/output circuit 21 through a plurality of column lines CL. The column decoder 35 may exchange the data DATA with the page buffer 37 through a plurality of data lines DL.

The page buffer 37 may selectively precharge a plurality of bit lines BL or sense the voltages or currents of the plurality of bit lines BL in response to the page buffer control signal PB_S. For a program operation, the page buffer 37 may apply a program-enable voltage (e.g., the "ground" voltage to the selected bit line and apply a program-inhibit voltage (e.g., a supply voltage) to an unselected bit line, depending on the received data DATA. For a read operation or a program verify operation, the page buffer 37 may precharge a selected bit line and discharge an unselected bit line.

The source line driver 39 may control a voltage that is applied to the common source line CSL in response to the source line control signal SL_S.

Figure 2:
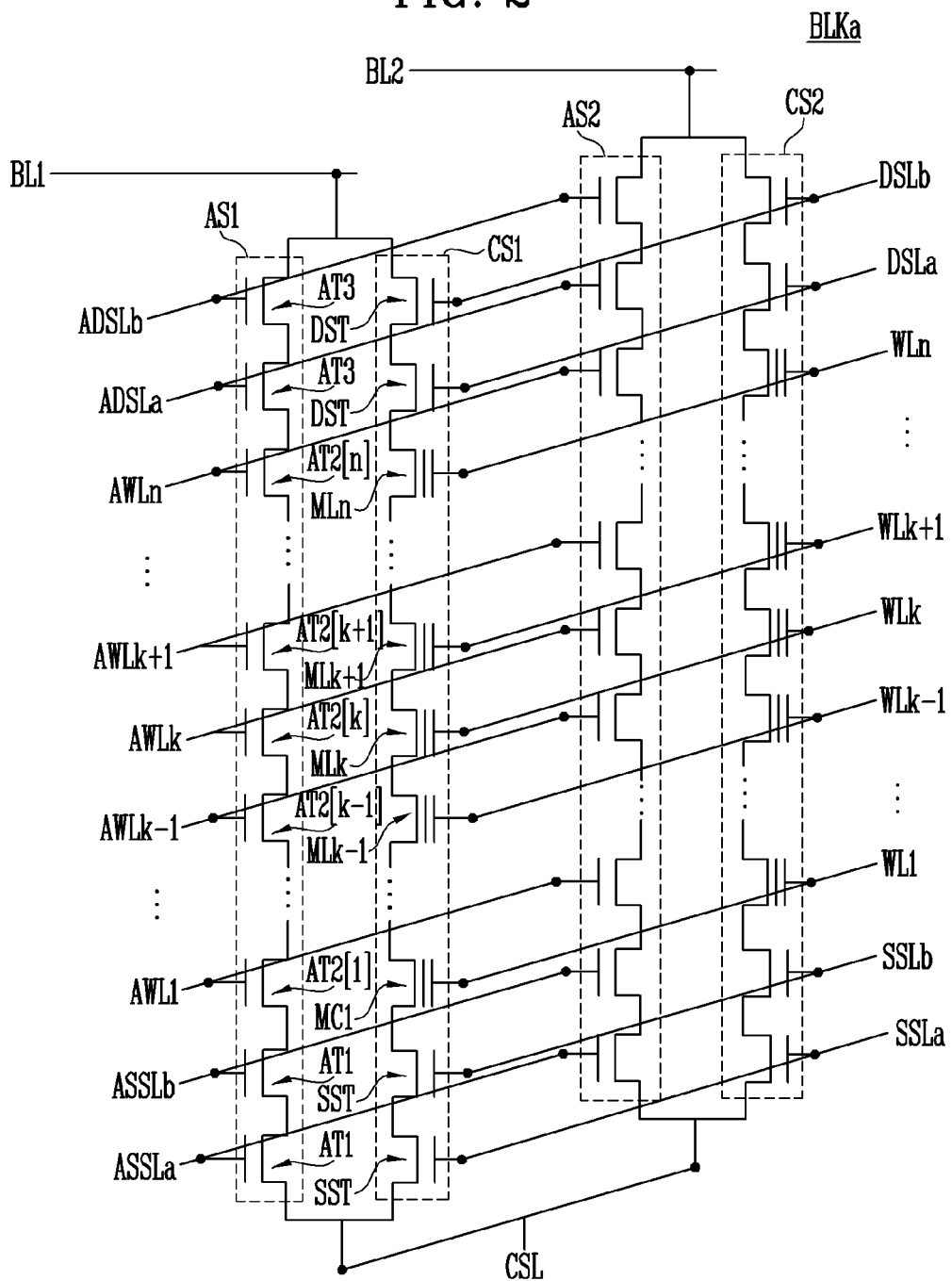
FIG. 2 is a circuit diagram illustrating a memory block according to an embodiment of the present disclosure.

FIG. 2 is a circuit diagram illustrating a portion of one memory block BLKa, among the plurality of memory blocks BLK[1] to BLK[Z] illustrated in FIG. 1.

As used herein, "cell string" refers to a circuit topology wherein transistors are connected "in series." As shown in FIG. 2, the drain (or source) of a first transistor is connected to the source (or drain) of a second transistor. The drain (or source) of the second transistor is connected to the source (or drain) of a third transistor, and so on. In FIG. 2, the memory block BLKa may include a plurality of cell strings CS1 and CS2 and a plurality of auxiliary strings AS1 and AS2. In FIG. 2, the auxiliary strings AS1 and AS2 are duplicates of the cell strings CS1 and CS2, respectively, and share connections to bit lines BLn and common source lines, CSL. The plurality of cell strings CS1 and CS2 and the plurality of auxiliary strings AS1 and AS2 may be coupled to a common source line CSL. The plurality of cell strings CS1 and CS2 and the plurality of auxiliary strings AS1 and AS2 may be coupled to a plurality of bit lines BL1 and BL2. The plurality of cell strings CS1 and CS2 may form a plurality of "pairs" or pairings with corresponding plurality of auxiliary strings AS1 and AS2. A cell string and an auxiliary string, forming a pair, may include channel regions defined on the same physical semiconductor channel layer. For example, a first side portion of the channel layer may be used as a channel region of the cell string, and a second side portion of the channel layer may be used as a channel region of the auxiliary string.

Each cell string may include at least one source select transistor SST, a plurality of memory cells MC1 to MCn (where n is a natural number equal to or greater than 2), and at least one drain select transistor DST. The source select transistor SST, the plurality of memory cells MC1 to MCn, and the drain select transistor DST may be stacked along the first side portion of the corresponding channel layer and may be coupled in series to each other. Each auxiliary string may include a plurality of auxiliary transistors AT1, AT2[1] to AT2[n], and AT3, which are stacked along the second side portion of the corresponding channel layer and are coupled in series to each other. The plurality of auxiliary transistors AT1, AT2[1] to AT2[n], and AT3 may include a first auxiliary transistor AT1 corresponding to the source select transistor SST, a plurality of second auxiliary transistors AT2[1] to AT2[n] corresponding to the plurality of memory cells MC1 to MCn, and a third auxiliary transistor AT3 corresponding to the drain select transistor DST.

FIG. 2 illustrates the first bit line BL1 and the second bit line BL2, among the plurality of bit lines, illustrates the first cell string CS1 and the second cell string CS2, among the plurality of cell strings, and the first auxiliary string AS1 and the second auxiliary string AS2, among the plurality of auxiliary strings, but the number of bit lines, the number of cell strings, and the number of auxiliary strings are not limited to those illustrated in the drawing.

Figure 3:
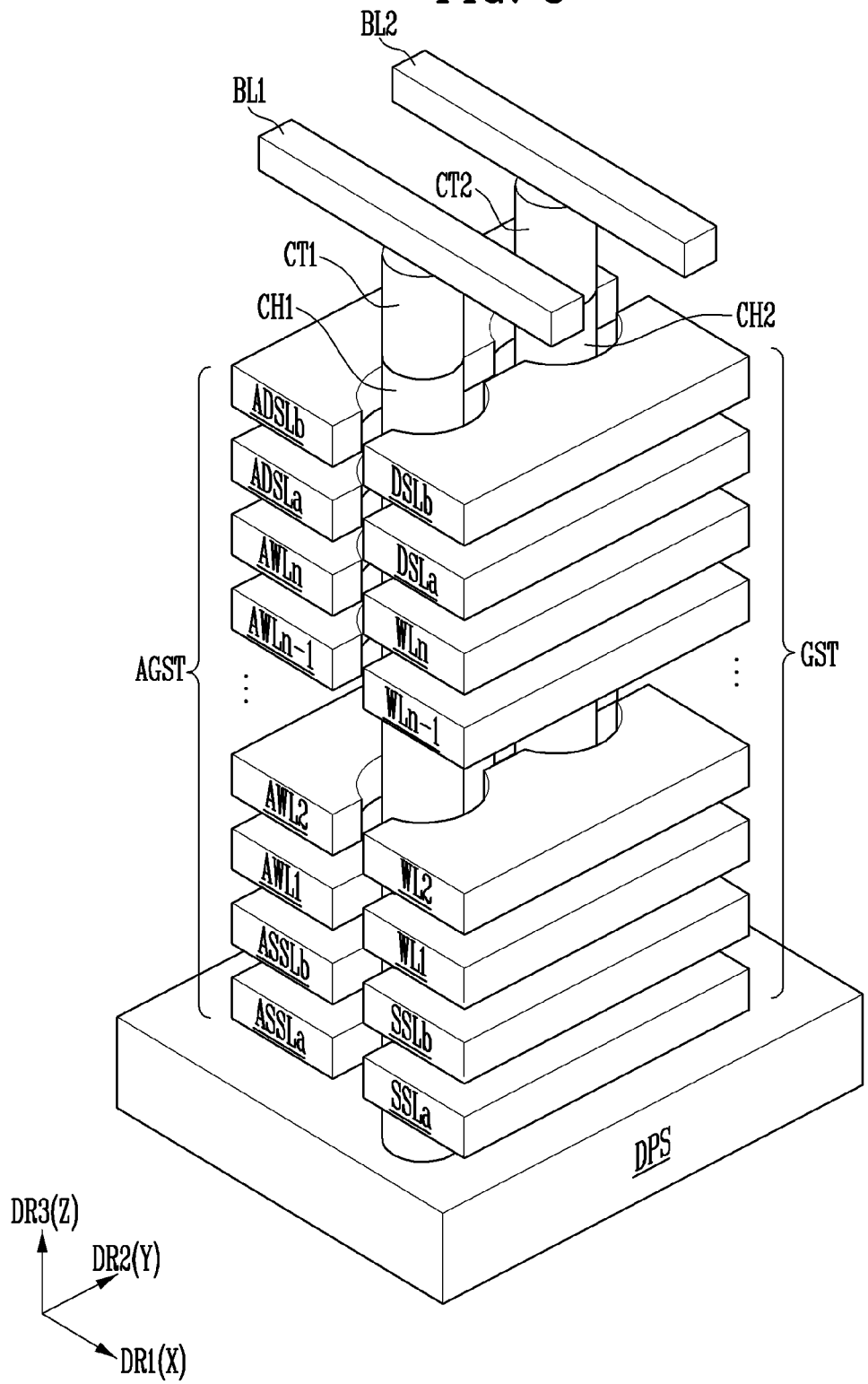
FIG. 3 is a perspective view illustrating a semiconductor memory device according to an embodiment of the present disclosure.

FIG. 3 is a perspective view illustrating a semiconductor memory device according to an embodiment of the present disclosure. In detail, FIG. 3 is a perspective view illustrating a partial structure of the semiconductor memory device for the first cell string CS1 and the first auxiliary string AS1 that are coupled to the first bit line BL1 illustrated in FIG. 2, and for the second cell string CS2 and the second auxiliary string AS2 that are coupled to the second bit line BL2.

Referring to FIGS. 2 and 3, the source select transistor SST, the plurality of memory cells MC1 to MCn, and the drain select transistor DST of the first cell string CS1 may be coupled in series to each other by a first channel layer CH1. The first auxiliary transistor AT1, the plurality of second auxiliary transistors AT2[1] to AT2[n], and the third auxiliary transistor AT3 of the first auxiliary string AS1 may be coupled in series to each other by the first channel layer CH1. The source select transistor SST, the plurality of memory cells MC1 to MCn, and the drain select transistor DST of the second cell string CS2 may be coupled in series to each other by a second channel layer CH2. The first auxiliary transistor AT1, the plurality of second auxiliary transistors AT2[1] to AT2[n], and the third auxiliary transistor AT3 of the second auxiliary string AS2 may be coupled in series to each other by the second channel layer CH2.

Referring to FIG. 3, the first channel layer CH1 and the second channel layer CH2 may be coupled to a doped semiconductor structure DPS. The doped semiconductor structure DPS may include surfaces extending along a first direction DR1 and an orthogonal second direction DR2, and the first channel layer CH1 and the second channel layer CH2 may extend in a third direction DR3. As shown in the figure, the first direction DR1, the second direction DR2, and the third direction DR3 are mutually orthogonal, which means that any pair of the three directions, DR1, DR2 and DR3, are orthogonal to each other. Consequently, directions DR1, DR2 and DR3, may be defined as directions in which axes intersecting each other "face" corresponding orthogonal directions. The directions may be denominated as an X-axis direction, a Y-axis direction, and a Z-axis direction of an XYZ coordinate system. In an embodiment, the doped semiconductor structure DPS may be used as a common source line CSL. In an embodiment, the doped semiconductor structure DPS may be a component coupled to the common source line CSL via a contact structure (not illustrated). In this case, the common source line CSL may be coupled to the first and second channel layers CH1 and CH2 via the doped semiconductor structure DPS.

As shown in FIG. 3, the first bit line BL1 and the second bit line BL2 may be laterally spaced apart from each other in the second direction DR2 and vertically spaced apart from the doped semiconductor structure DPS in the third direction DR3. The first bit line BL1 may be coupled to the first channel layer CH1, and the second bit line BL2 may be coupled to the second channel layer CH2. In an embodiment, the first bit line BL1 may be coupled to the first channel layer CH1 through a first conductive contact structure CT1, and the second bit line BL2 may be coupled to the second channel layer CH2 through a second conductive contact structure CT2. In an embodiment, the first bit line BL1 and the second bit line BL2 may directly contact the first channel layer CH1 and the second channel layer CH2.

The first bit line BL1 and the second bit line BL2 may extend parallel to each other in one direction. In an embodiment, the first bit line BL1 and the second bit line BL2 may extend parallel to each other in the first direction DR1.

A gate stacked body GST and an auxiliary gate stacked body AGST may be disposed between each of the first bit line BL1 and the second bit line BL2 and the doped semiconductor structure DPS. The gate stacked body GST may include a plurality of gate electrodes SSLa, SSLb, WL1 to WLn, DSLa, and DSLb, which are stacked to be spaced apart from each other in the third direction DR3. The auxiliary gate stacked body AGST may include a plurality of auxiliary gate electrodes ASSLa, ASSLb, AWL1 to AWLn, ADSLa, and ADSLb, which are stacked to be spaced apart from each other in the third direction DR3.

The plurality of gate electrodes SSLa, SSLb, WL1 to WLn, DSLa, and DSLb may include a source select line (e.g., SSLa) implemented as at least one layer, a plurality of word lines WL1 to WLn, and a drain select line (e.g., DSLa) implemented as at least one layer, which are stacked to be spaced apart from each other in the third direction DR3. The plurality of auxiliary gate electrodes ASSLa, ASSLb, AWL1 to AWLn, ADSLa, and ADSLb may include an auxiliary source select line (e.g., ASSLa) implemented as at least one layer, a plurality of auxiliary word lines AWL1 to AWLn, and an auxiliary drain select line (e.g., ADSLa) implemented as at least one layer, which are stacked to be spaced apart from each other in the third direction DR3. Although FIG. 3 illustrates the case where the gate stacked body GST includes the first source select line SSLa, the second source select line SSLb, the first drain select line DSLa, and the second drain select line DSLb, and the auxiliary gate stacked body AGST includes the first auxiliary source select line ASSLa, the second auxiliary source select line ASSLb, the first auxiliary drain select line ADSLa, and the second auxiliary drain select line ADSLb, the number of source select lines, the number of drain select lines, the number of auxiliary source select lines, and the number of auxiliary drain select lines are not limited thereto.

The plurality of auxiliary gate electrodes ASSLa, ASSLb, AWL1 to AWLn, ADSLa, and ADSLb may be disposed at substantially the same physical levels, (i.e., layers, which are at the same or substantially the same physical distance from the DPS layer in FIG. 3, or from some other reference location) as the plurality of gate electrodes SSLa, SSLb, WL1 to WLn, DSLa, and DSLb. For example, the plurality of auxiliary word lines AWL1 to AWLn may be disposed at substantially same physical levels (layers) as the plurality of word lines WL1 to WLn.

Referring to FIGS. 2 and 3, the source select line SSLa or SSLb may be provided as a gate electrode of the source select transistor SST, the plurality of word lines WL1 to WLn may be provided as gate electrodes of the plurality of memory cells MC1 to MCn, and the drain select line DSLa or DSLb may be provided as a gate electrode of the drain select transistor DST. The auxiliary source select line ASSLa or ASSLb may be provided as a gate electrode of the first auxiliary transistor AT1, the plurality of auxiliary word lines AWL1 to AWLn may be provided as gate electrodes of the plurality of second auxiliary transistors AT2[1] to AT2[n], and the auxiliary drain select line ADSLa or ADSLb may be provided as a gate electrode of the third auxiliary transistor AT3.

The plurality of gate electrodes SSLa, SSLb, WL1 to WLn, DSLa, and DSLb may be spaced apart from the plurality of auxiliary gate electrodes ASSLa, ASSLb, AWL1 to AWLn, ADSLa, and ADSLb, with the first channel layer CH1 and the second channel layer CH2 interposed therebetween.

Each of the first channel layer CH1 and the second channel layer CH2 may include the channel region of the cell string (e.g., CS1 or CS2) controlled by the plurality of gate electrodes SSLa, SSLb, WL1 to WLn, DSLa, and DSLb, and the channel region of the auxiliary string (e.g., AS1 or AS2) controlled by the plurality of auxiliary gate electrodes ASSLa, ASSLb, AWL1 to AWLn, ADSLa, and ADSLb.

The plurality of gate electrodes SSLa, SSLb, WL1 to WLn, DSLa, and DSLb may extend adjacent to the first channel layer CH1 and the second channel layer CH2 so that the channel region of the first cell string CS1 and the channel region of the second cell string CS2 may be controlled. The plurality of auxiliary gate electrodes ASSLa, ASSLb, AWL1 to AWLn, ADSLa, and ADSLb may extend adjacent to the first channel layer CH1 and the second channel layer CH2 so that the channel region of the first auxiliary string AS1 and the channel region of the second auxiliary string AS2 may be controlled. In an embodiment, the plurality of gate electrodes SSLa, SSLb, WL1 to WLn, DSLa, and DSLb and the plurality of auxiliary gate electrodes ASSLa, ASSLb, AWL1 to AWLn, ADSLa, and ADSLb may extend in a direction in which the first channel layer CH1 and the second channel layer CH2 are arranged. For example, the first channel layer CH1 and the second channel layer CH2 may be arranged to be spaced apart from each other in the second direction DR2, and the plurality of gate electrodes SSLa, SSLb, WL1 to WLn, DSLa, and DSLb and the plurality of auxiliary gate electrodes ASSLa, ASSLb, AWL1 to AWLn, ADSLa, and ADSLb may extend in the second direction DR2.

Referring to FIG. 3, each of the first channel layer CH1 and the second channel layer CH2 may be spaced apart from the gate stacked body GST and the auxiliary gate stacked body AGST. Although an intervening structure that extends from a space between each of the first channel layer CH1 and the second channel layer CH2 and the gate stacked body GST to a space between each of the first channel layer CH1 and the second channel layer CH2 and the auxiliary gate stacked body AGST is omitted in FIG. 3, the intervening structure according to embodiments of the present disclosure will be described in detail below with reference to FIGS. 4A and 4B. The intervening structure may include a tunnel insulating layer, a data storage layer, and a blocking insulating layer.

Figure 4A:
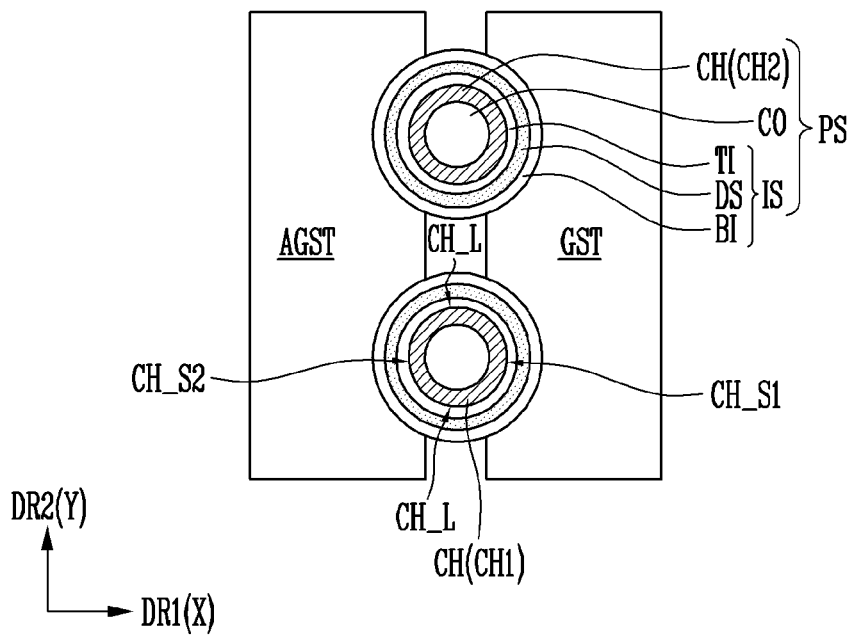
FIGS. 4A and 4B are plan views illustrating a semiconductor memory device according to embodiments of the present disclosure.
Figure 4B:
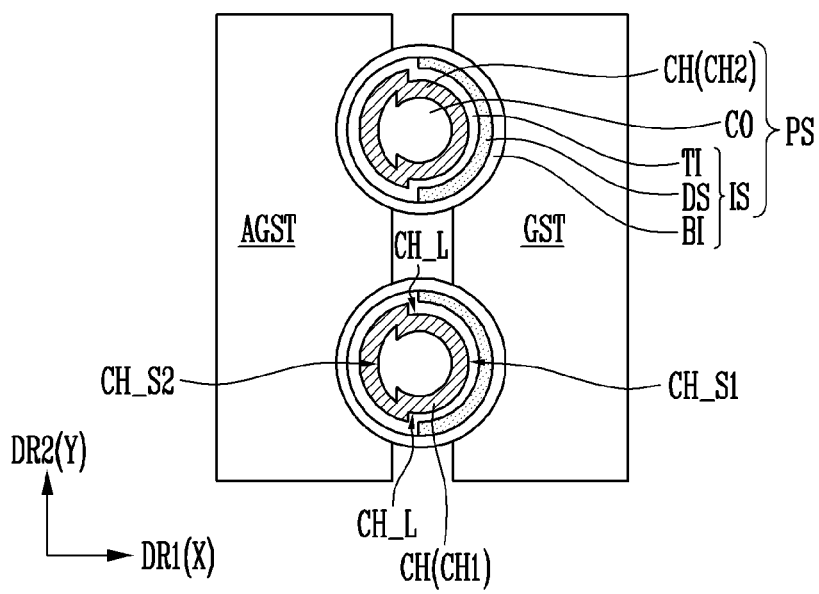

FIGS. 4A and 4B are plan views illustrating a semiconductor memory device according to embodiments of the present disclosure. Hereinafter, repeated descriptions of a configuration identical to that of FIG. 3 will be omitted.

Referring to FIGS. 4A and 4B, each of an auxiliary gate stacked body AGST and a gate stacked body GST may extend in a first direction DR1 and a second direction DR2. A "pillar" is a well-known structure having a shape which is the same as or at least reminiscent of a column or post. In FIGS. 4A and 4B, a plurality of pillar structures PS, are depicted extending into the geometric planes of FIGS. 4A and 4B. The pillar structure PS may have a substantially pillar-like shape. The pillar structures PS may be located or "disposed" between the auxiliary gate stacked body AGST and the gate stacked body GST. The plurality of pillar structures PS, each of which has a geometric center, not shown, are located or arranged such that the centers of the pillar structure PS, may be arranged to follow along or be in alignment with a geometric line extending in the second direction DR2. As shown in the figures, the pillar structure PS may be arranged to be spaced apart from each other in the second direction DR2, with substantially equal distances between them. Each of the pillar structures PS may include a core insulating layer CO, a channel layer CH, and an intervening structure IS.

The channel layer CH, which is substantially ring-shaped or annulus-shaped, also may extend into the plane of FIGS. 4A and 4B. The channel layer CH may be formed of a semiconductor material such as silicon or germanium. The channel layer CH may be used as the first channel structure CH1 or the second channel structure CH2 illustrated in FIG. 3. The channel layer CH may enclose a sidewall of the core insulating layer CO. The channel layer CH, is considered herein as having substantially Quonset-shaped "side portions" which are not flat or planar as the word "side" implies. "Side portions" are instead convex portions or sections of the outer sidewall surface of the annulus-shaped channel layer CH. The side portions are thus portions of the outer sidewall, located between two radii that extend outward from or at least near the geometric center of the annulus-shaped channel layer CH and which subtend an angle between them that is greater than zero degrees but less than 180 degrees. As shown in FIGS. 4A and 4B, the channel layer CH may therefore include a first side portion CH_S1, a second side portion CH_S2, and a connector CH_L, between them, all of them being located on the outer sidewall surface of the channel layer CH and thus convex.

The connector CH_L is between the first and second side portions CH_S1 and CH_S2. The first side portion CH_S1 and the second side portion CH_S2 may "face" in different directions on the same plane, means that corresponding geometric normals to the convex side portions, extend away from each other. In an embodiment, the first side portion CH_S1 and the second side portion CH_S2 may face in different directions, i.e., away from each other, on an XY plane. The first side portion CH_S1 may be enclosed or covered by the gate stacked body GST, and the second side portion CH_S2 may be enclosed or covered by the auxiliary gate stacked body AGST. The connector CH_L may extend from the first side portion CH_S1 to the second side portion CH_S2, and may couple the first side portion CH_S1 to the second side portion CH_S2. The connector CH_L might not "face" the gate stacked body GST and the auxiliary gate stacked body AGST, and may instead "face" a space between the gate stacked body GST and the auxiliary gate stacked body AGST.

The intervening structure IS, may include a tunnel insulating layer TI, a data storage layer DS, and a blocking insulating layer BI. The tunnel insulating layer TI may be formed of a silicon oxide layer enabling charge tunneling. The data storage layer DS may be formed of a material layer capable of storing changed data using Fowler-Nordheim tunneling. For this, the data storage layer DS may be formed of various materials, for example, a charge trap layer. The charge trap layer may include a silicon nitride layer. The present disclosure is not limited thereto, and the data storage layer DS may include a phase change material, nanodots, etc. The blocking insulating layer BI may include an insulating material capable of blocking charges.

The tunnel insulating layer TI may extend from a space between the gate stacked body GST and the channel layer CH to a space between the auxiliary gate stacked body AGST and the channel layer CH. In other words, the tunnel insulating layer TI may extend along the first side portion CH_S1, the second side portion CH_S2, and the connector CH_L of the channel layer CH.

Referring to FIG. 4A, the data storage layer DS may extend from a space between the gate stacked body GST and the tunnel insulating layer TI to a space between the auxiliary gate stacked body AGST and the tunnel insulating layer TI. In other words, the data storage layer DS may extend along the first side portion CH_S1, the second side portion CH_S2, and the connector CH_L of the channel layer CH, and may be disposed between the first side portion CH_S1 of the channel layer CH and the gate stacked body GST and between the second side portion CH_S2 of the channel layer CH and the auxiliary gate stacked body AGST.

The blocking insulating layer BI may extend from a space between the gate stacked body GST and the data storage layer DS to a space between the auxiliary gate stacked body AGST and the data storage layer DS. In other words, the blocking insulating layer BI may extend along the first side portion CH_S1, the second side portion CH_S2, and the connector CH_L of the channel layer CH.

Referring to FIG. 4B, the data storage layer DS may be disposed between the gate stacked body GST and the tunnel insulating layer TI, and may be cut such that a partial sidewall of the channel layer CH facing the auxiliary gate stacked body AGST is opened. In other words, the data storage layer DS may extend along the first side portion CH_S1 of the channel layer CH, and may be cut to open the second side portion CH_S2 of the channel layer CH. In this way, the data storage layer DS may be interposed between the first side portion CH_S1 of the channel layer CH and the gate stacked body GST, but may be excluded between the second side portion CH_S2 of the channel layer CH and the auxiliary gate stacked body AGST.

The blocking insulating layer BI may extend from a space between the gate stacked body GST and the data storage layer DS to a space between the auxiliary gate stacked body AGST and the tunnel insulating layer TI. The blocking insulating layer BI may be spaced apart from a portion of the tunnel insulating layer TI by the data storage layer DS between the first side portion CH_S1 of the channel layer CH and the gate stacked body GST. The blocking insulating layer BI may contact the other portion of the tunnel insulating layer TI between the second side portion CH_S2 of the channel layer CH and the auxiliary gate stacked body AGST.

As described above, the semiconductor memory device according to embodiments of the present disclosure may include a plurality of cell strings coupled to the same gate electrode, and a plurality of auxiliary strings coupled to the same auxiliary gate electrode. The plurality of auxiliary strings may be form pairs with the plurality of cell strings. A cell string and an auxiliary string forming the same pair may be coupled to the same channel layer, and the auxiliary string may be used to improve the operational reliability of the cell string.

Figure 5A:
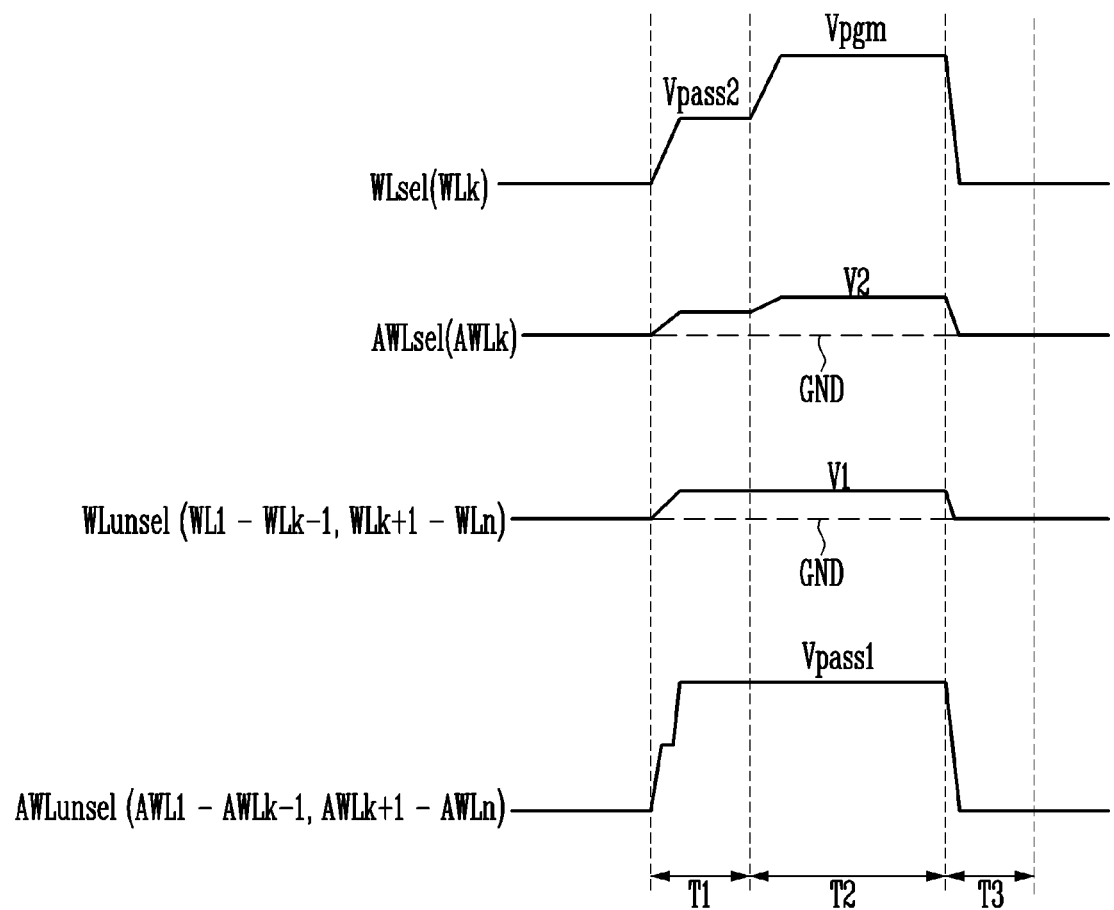
FIGS. 5A to 5C are diagrams for explaining a program operation of a semiconductor memory device according to an embodiment of the present disclosure.
Figure 5B:
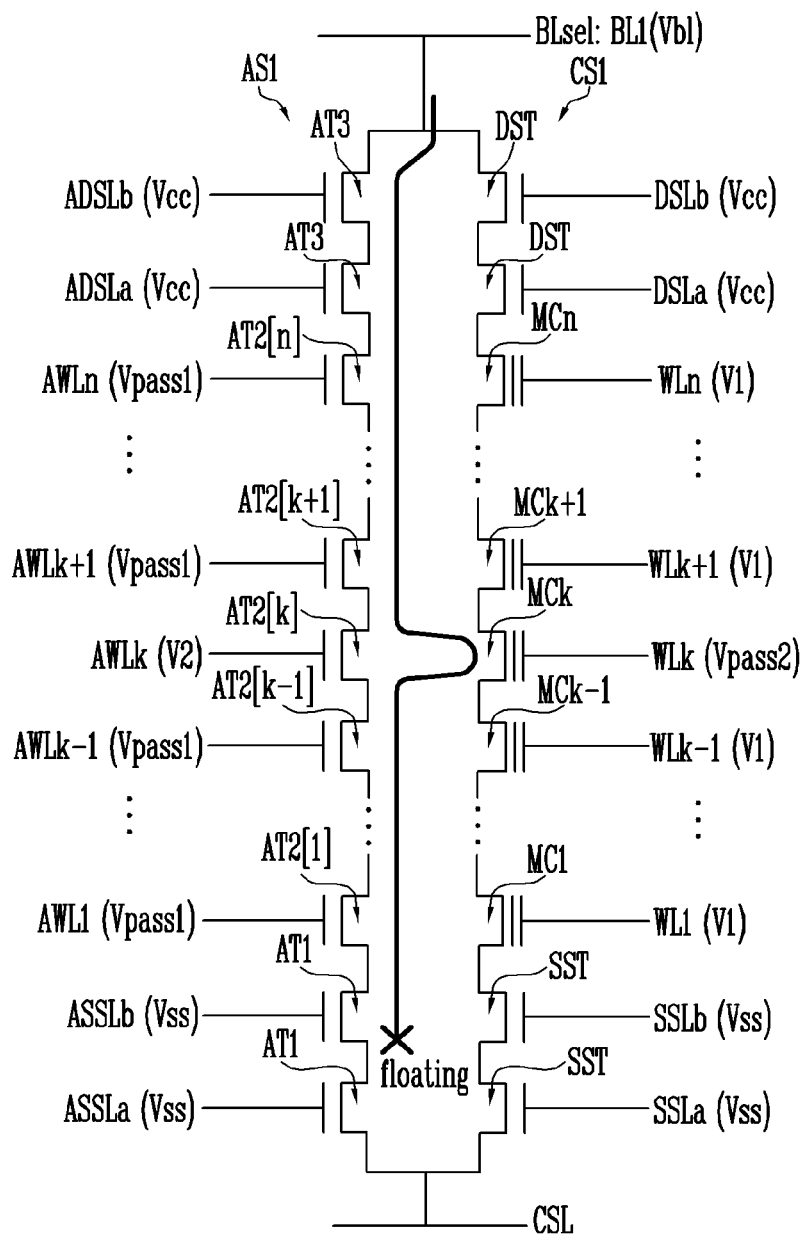
Figure 5C:
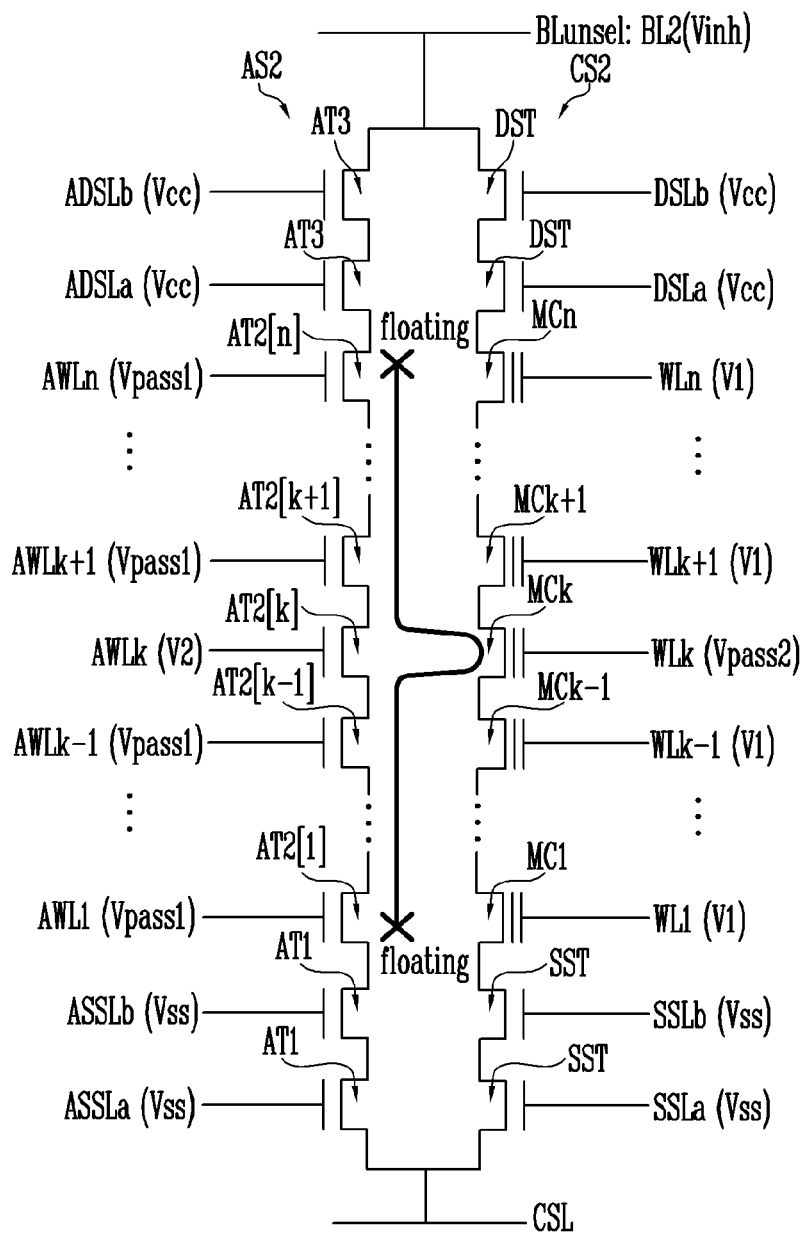

FIGS. 5A to 5C are diagrams for explaining a program operation of a semiconductor memory device according to an embodiment of the present disclosure.

FIG. 5A is a timing diagram illustrating changes in voltages applied to a plurality of word lines WL1 to WLn and a plurality of auxiliary word lines AWL1 to AWLn of a selected memory block during a program operation. Referring to FIG. 5A, the program operation may include a channel boosting period T1, a program voltage apply period T2, and a discharge period T3.

FIG. 5B is a circuit diagram for explaining the operation of a cell string (e.g., a first cell string CS1) and an auxiliary string (e.g., a first auxiliary string AS1) that are coupled to a selected bit line BLsel (e.g., a first bit line BL1) during the channel boosting period T1. FIG. 5C is a circuit diagram for explaining the operation of a cell string (e.g., a second cell string CS2) and an auxiliary string (e.g., a second auxiliary string AS2) that are coupled to an unselected bit line BLunsel (e.g., a second bit line BL2) during the channel boosting period T1.

Referring to FIGS. 5A to 5C, setup voltages may be provided to bit lines to perform the program operation. In an embodiment, a program-enable voltage Vbl may be applied to the selected bit line BLsel (BL1), and a program-inhibit voltage Vinh may be applied to the unselected bit line BLunsel (BL2). The program-enable voltage Vbl may be a "ground" or reference voltage, such as zero volts. It may also be a positive voltage the magnitude of which is less than, i.e., a lesser magnitude than the program-inhibit voltage Vinh. Also, a supply voltage Vcc may be applied to drain select lines DSLa and DSLb and auxiliary drain select lines ADSLa and ADSLb. Further, a ground voltage Vss may be applied to source select lines SSLa and SSLb and auxiliary source select lines ASSLa and ASSLb. Because the ground voltage Vss is applied to the source select lines SSLa and SSLb and the auxiliary source select lines ASSLa and ASSLb, the first cell string CS1, the first auxiliary string AS1, the second cell string CS2, and the second auxiliary string AS2 coupled thereto may be electrically isolated from a common source line CSL.

During the channel boosting period T1, a pass voltage Vpass2 may be applied to a selected word line (e.g., WLk, where k is an integer less than or equal to n), and a first voltage V1 may be applied to the remaining word lines, that is, unselected word lines (e.g., WL1 to WLk−1 and WLk+1 to WLn). A second voltage V2 may be applied to a selected auxiliary word line AWLk arranged at a substantially same level, i.e., magnitude as the selected word line WLk. Furthermore, a pass voltage Vpass1 may be applied to unselected auxiliary word lines AWL1 to AWLk−1 and AWLk+1 to AWLn arranged at substantially same levels as the unselected word lines WL1 to WLk−1 and WLk+1 to WLn. Hereinafter, the pass voltage applied to the unselected auxiliary word lines AWL1 to AWLk−1 and AWLk+1 to AWLn is designated as a first pass voltage Vpass1, and the pass voltage applied to the selected word line WLk is designated as a second pass voltage Vpass2.

During the channel boosting period T1, channels may be formed in respective memory cells MCk of the first cell string CS1 and the second cell string CS2 coupled to the selected word line WLk by the second pass voltage Vpass2. Further, respective channels may be formed in second auxiliary transistors AT2[1] to AT2[k−1] and AT2[k+1] to AT2[n] of the first auxiliary string AS1 and the second auxiliary string AS2 coupled to the unselected auxiliary word lines AWL1 to AWLk−1 and AWLk+1 to AWLn by the first pass voltage Vpass1. Accordingly, a first channel layer (e.g., CH1 of FIG. 3) forming the channel region of the first cell string CS1 and the channel region of the first auxiliary string AS1 coupled to the selected bit line BLsel may be coupled to the selected bit line BLsel to which the program-enable voltage Vbl is applied. Here, when the program-enable voltage Vbl is a ground voltage, the first channel layer (e.g., CH1 of FIG. 3) may have a voltage of 0 V.

During the channel boosting period T1, the voltage of the channel region of the second cell string CS2 coupled to the unselected bit line BLunsel may be increased by the difference between the program-inhibit voltage Vinh and the threshold voltage of the drain select transistor (e.g., DST coupled to DSLa), and the drain select transistor (e.g., DST coupled to DSLa) may be turned off. Similarly, the voltage of the channel region of the second auxiliary string AS2 coupled to the unselected bit line BLunsel may be increased by the difference between the program-inhibit voltage Vinh and the threshold voltage of the third auxiliary transistor (e.g., AT3 coupled to ADSLa), and the third auxiliary transistor (e.g., AT3 coupled to ADSLa) may be turned off. In this way, a second channel layer (e.g., CH2 of FIG. 3) forming the channel region of the second cell string CS2 and the channel region of the second auxiliary string AS2 may float. Thereafter, due to the influence of coupling attributable to the first pass voltage Vpass1 and the second pass voltage Vpass2, the voltage of the second channel layer (e.g., CH2 of FIG. 3) may be further increased.

Subsequently, during the program voltage apply period T2, the voltage applied to the selected word line WLk may be increased from the second pass voltage Vpass2 to a program voltage Vpgm.

When the program voltage Vpgm is applied to the selected word line WLk, the voltage of the first channel layer (e.g., CH1 of FIG. 3) forming the channel region of the first cell string CS1 and the channel region of the first auxiliary string AS1 is maintained at the setup voltage (e.g., 0 V). Therefore, due to the difference between the channel voltage of the memory cell MCk of the first cell string CS1 coupled to the selected word line WLk and the program voltage Vpgm applied to the selected word line WLk, Fowler-Nordheim tunneling may occur. Accordingly, the memory cell MCk of the first cell string CS1 may be programmed.

When the program voltage Vpgm is applied to the selected word line WLk, the voltage of the second channel layer (e.g., CH2 of FIG. 3) forming the channel region of the second cell string CS2 and the channel region of the second auxiliary string AS2 may be further increased to reach a boosting voltage. Because the difference between the program voltage Vpgm and the boosting voltage is not large enough to incur Fowler-Nordheim tunneling, the memory cell MCk of the second cell string CS2 coupled to the selected word line WLk may be program-inhibited.

The first pass voltage Vpass1 may be supplied from the voltage supply circuit 30 of FIG. 1 at the same or substantially the same level as the second pass voltage Vpass2, or at the level higher than that of the second pass voltage Vpass2. As the boosting voltage of the unselected second channel layer (e.g., CH2 of FIG. 3) for providing the channel regions of the unselected second cell string CS2 and the unselected second auxiliary string AS2 is increased, a program inhibition effect may be further increased. Accordingly, when the first pass voltage Vpass1 has a level or magnitude greater than that of the second pass voltage Vpass2, the program-inhibition effect may be increased by improving boosting efficiency. The second pass voltage Vpass2 may be maintained at a uniform level, or may be increased in a stepwise manner. For example, after the second pass voltage Vpass2 is increased in a stepwise manner during the channel boosting period T1, it may be maintained at the increased level during the program voltage apply period T2.

During the program voltage apply period T2, the first voltage V1 may be applied to unselected word lines (e.g., WL1 to WLk−1 and WLk+1 to WLn), and the second voltage V2 may be applied to the selected auxiliary word line AWLk.

A positive voltage, less than the first pass voltage Vpass1 and the second pass voltage Vpass2, or the ground voltage GND may be provided as the first voltage V1 and the second voltage V2 from the voltage supply circuit 30 of FIG. 1. The first voltage V1 and the second voltage V2 may be equal to or different from each other. Each of the first voltage V1 and the second voltage V2 may be maintained at a uniform level or may be increased in a stepwise manner. For example, after the first voltage V1 may be increased during the channel boosting period T1, it may be maintained at the increased level during the program voltage apply period T2. The second voltage may be applied at a first level during the channel boosting period T1, and may be increased to a second level during the program voltage apply period T2. The embodiments of the present disclosure are not limited thereto, and the level increasing timing of the first voltage V1 and the second voltage V2 may be variously controlled.

In accordance with an embodiment of the present disclosure, the first voltage V1 that is applied to unselected word lines (e.g., WL1 to WLk−1 and WLk+1 to WLn) may be supplied from the voltage supply circuit 30 of FIG. 1 at a level less than those of the first pass voltage Vpass1 and the second pass voltage Vpass2. Accordingly, during the program operation, a pass disturb phenomenon in which memory cells MC1 to MCk−1 and MCk+1 to MCn coupled to the unselected word lines WL1 to WLk−1 and WLk+1 to WLn are unintentionally programmed may be suppressed.

In accordance with an embodiment of the present disclosure, the second voltage V2 that is applied to the selected auxiliary word line AWLk may be supplied from the voltage supply circuit 30 of FIG. 1 at a level less than those of the first pass voltage Vpass1 and the second pass voltage Vpass2. Therefore, during the program operation, a phenomenon in which the threshold voltages of the second auxiliary transistors AT2[k] coupled to the selected auxiliary word line AWLk vary may be suppressed. In this way, the threshold voltages of the second auxiliary transistors AT2[k] may be maintained in an erased state.

During the discharge period T3 after the program voltage apply period T2, the voltages that are applied to the selected bit line BLsel, the unselected bit line BLunsel, the selected word line WLk, the selected auxiliary word line AWLk, the unselected word lines WL1 to WLk−1 and WLk+1 to WLn, and the unselected auxiliary word lines AWL1 to AWLk−1 and AWLk+1 to AWLn may be discharged. Thereafter, a verify operation of verifying the program operation may be performed. The verify operation may be similar to a read operation, which will be described below.

Figure 6A:
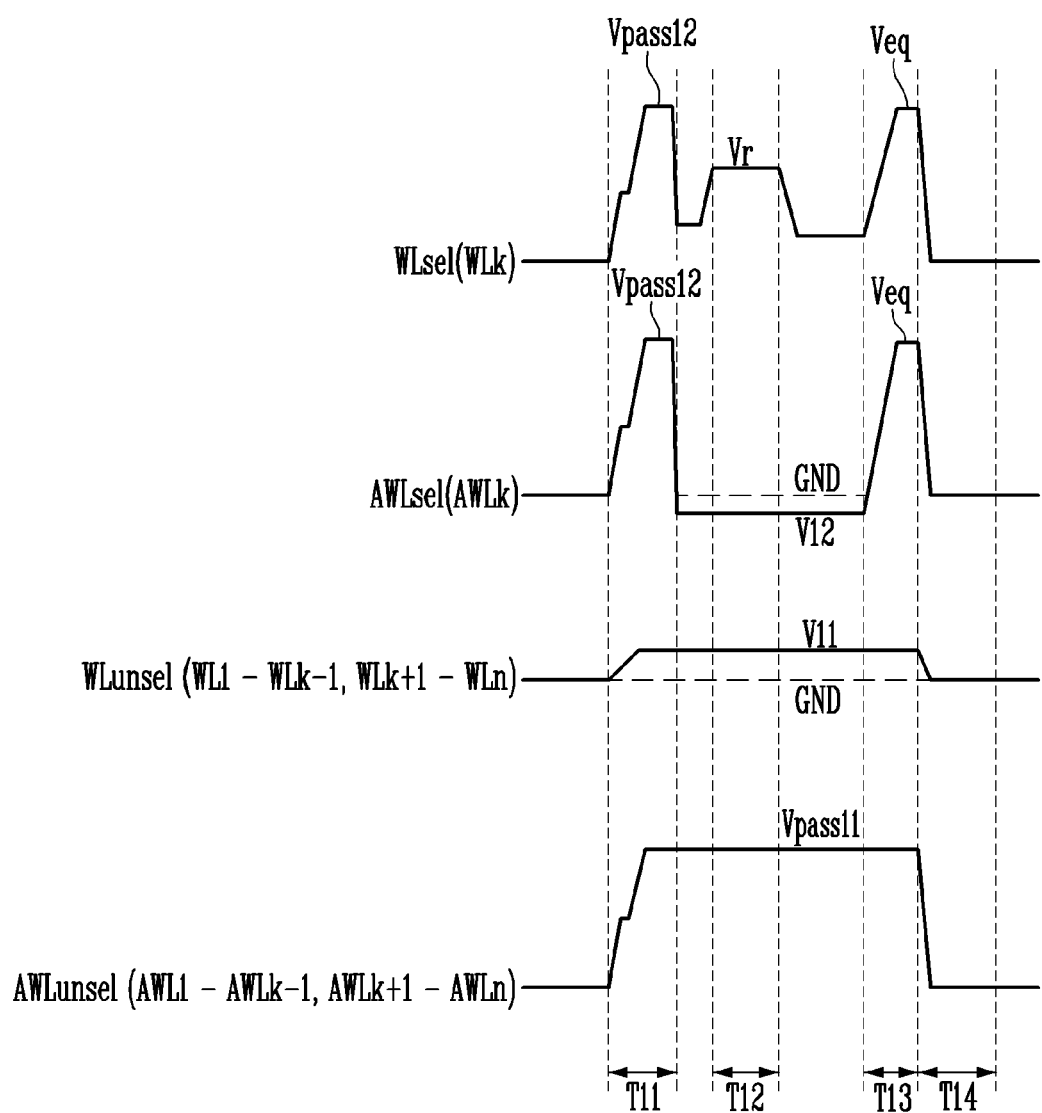
FIGS. 6A and 6B are diagrams for explaining a read operation of a semiconductor memory device according to an embodiment of the present disclosure.
Figure 6B:
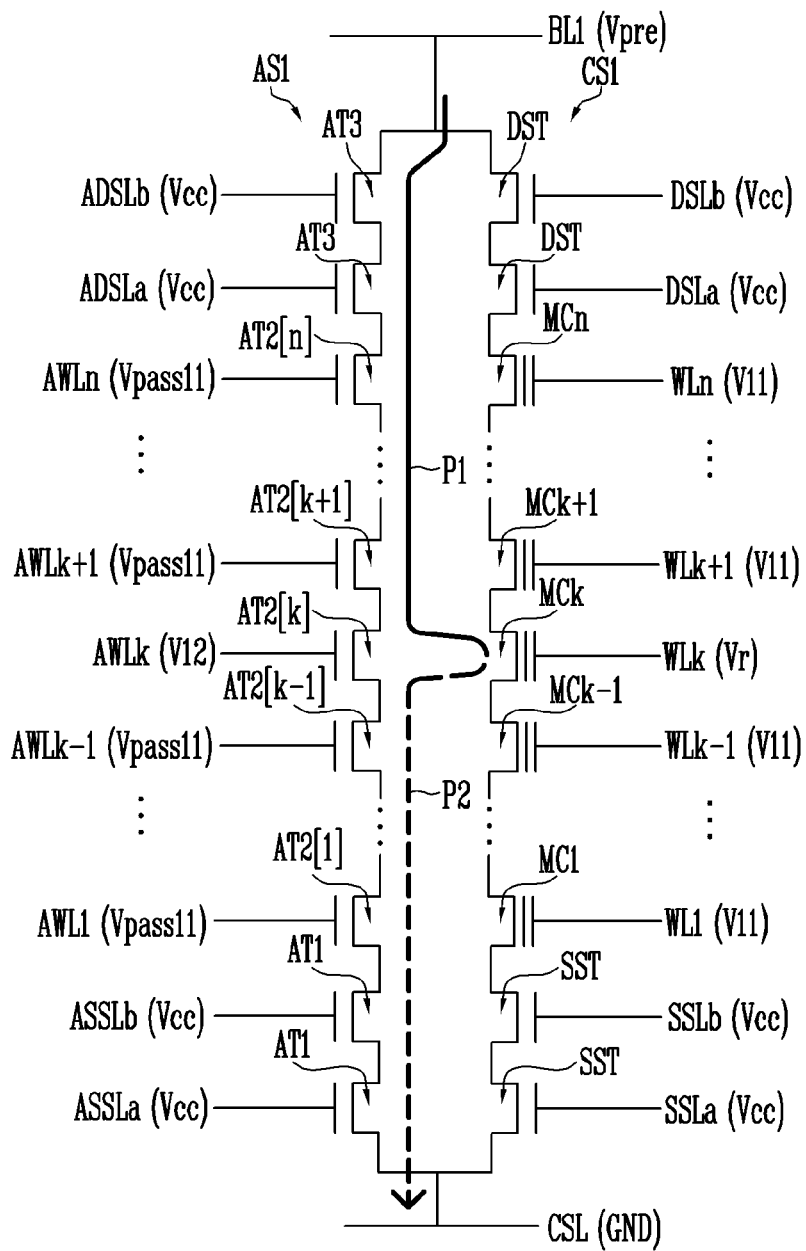

FIGS. 6A and 6B are diagrams for explaining a read operation of a semiconductor memory device according to an embodiment of the present disclosure.

FIG. 6A is a timing diagram illustrating changes in voltages applied to a plurality of word lines WL1 to WLn and a plurality of auxiliary word lines AWL1 to AWLn of a selected memory block during a read operation. Referring to FIG. 6A, the read operation may include a channel initialization period T11, an evaluation period T12, an equalizing period T13, and a discharge period T14.

FIG. 6B is a circuit diagram for explaining the operation of a first cell string CS1 and a first auxiliary string AS1 coupled to a first bit line BL1 during the evaluation period T12.

Referring to FIGS. 6A and 6B, for the read operation, after the first bit line BL1 is precharged to a precharge voltage Vpre, a pass voltage Vpass12 may be applied to a selected word line (e.g., WLk, where k is a natural number less than or equal to n) and a selected auxiliary word line AWLk disposed at a substantially same level as the selected word line WLk during the channel initialization period T11. Further, a first voltage V11 may be applied to unselected word lines (e.g., WL1 to WLk−1 and WLk+1 to WLn), and a pass voltage Vpass11 may be applied to unselected auxiliary word lines (e.g., AWL1 to AWLk−1 and AWLk+1 to AWLn) disposed at substantially same levels as the unselected word lines WL1 to WLk−1 and WLk+1 to WLn. Hereinafter, the pass voltage applied to the unselected auxiliary word lines AWL1 to AWLk−1 and AWLk+1 to AWLn is designated as the first pass voltage Vpass11, and the pass voltage applied to the selected word line WLk and the selected auxiliary word line AWLk is designated as a second pass voltage Vpass12.

During the channel initialization period T11, a supply voltage Vcc may be applied to drain select lines DSLa and DSLb, auxiliary drain select lines ADSLa and ADSLb, source select lines SSLa and SSLb, and auxiliary source select lines ASSLa and ASSLb. A ground voltage GND may be applied to the common source line CSL.

During the above-described channel initialization period T11, a source select transistor SST, a plurality of memory cells MC1 to MCn, a drain select transistor DST, and a plurality of auxiliary transistors AT1, AT2[1] to AT2[n], and AT3 may be turned on, and thus respective channel regions of the first cell string CS1 and the first auxiliary string AS1 may be initialized.

Subsequently, during the evaluation period T12, a read voltage Vr may be applied to the selected word line WLk, and a second voltage V12 may be applied to the selected auxiliary word line AWLk.

The first pass voltage Vpass11 applied to the unselected auxiliary word lines AWL1 to AWLk−1 and AWLk+1 to AWLn may be maintained during the evaluation period T12 from the channel initialization period T11.

The second pass voltage Vpass12 applied to the selected word line WLk may be discharged before the read voltage Vr is applied to the selected word line WLk. The embodiment of the present disclosure is not limited thereto, and the second pass voltage Vpass12 applied to the selected word line WLk may be maintained until the read voltage Vr is applied.

During the evaluation period T12, respective channels may be formed in second auxiliary transistors AT2[1] to AT2[k−1] and AT2[k+1] to AT2[n] coupled to the unselected auxiliary word lines AWL1 to AWLk−1 and AWLk+1 to AWLn by the first pass voltage Vpass11. Whether a channel is to be formed in the memory cell MCk using the read voltage Vr may be determined depending on the data storage state of the memory cell MCk coupled to the selected word line WLk. For example, the memory cell MCk may have a data storage state corresponding to a threshold voltage higher than the read voltage Vr. In this case, even if the read voltage Vr is applied, a channel is not formed in the memory cell MCk, and the precharge voltage Vpre of the first bit line BL1 may be maintained without being discharged along a source-side path P2. On the other hand, the memory cell MCk may have a data storage state corresponding to a threshold voltage less than the read voltage Vr. In this case, when the read voltage Vr is applied, a channel may be formed in the memory cell MCk, and the precharge voltage Vpre of the first bit line BL1 may be discharged along a drain-side path P1 and the source-side path P2. During the evaluation period T12, the page buffer 37 illustrated in FIG. 1 may read data stored in the memory cell MCk by sensing a change in the voltage or current level of the first bit line BL1 depending on whether the precharge voltage Vpre is discharged.

The first pass voltage Vpass11 may be supplied from the voltage supply circuit 30 of FIG. 1 at the same level as the second pass voltage Vpass12, or at the level higher than that of the second pass voltage Vpass12. When the second pass voltage Vpass12 has a level higher than that of the first pass voltage Vpass11, a sensing voltage or a sensing current may be increased upon reading the data stored in the memory cell MCk, and thus a reading margin may be improved. Each of the first pass voltage Vpass11 and the second pass voltage Vpass12 may be maintained at a uniform level or may be increased in a stepwise manner. For example, each of the first pass voltage Vpass11 and the second pass voltage Vpass12 may be increased in a stepwise manner during the channel initialization period T11. The first pass voltage Vpass11 having the increased level may be maintained and applied to the unselected auxiliary word lines AWL1 to AWLk−1 and AWLk+1 to AWLn during the evaluation period T12.

A positive voltage, less than the first pass voltage Vpass11 and the second pass voltage Vpass12, or the ground voltage GND may be provided as the first voltage V11 from the voltage supply circuit 30 of FIG. 1. The first voltage V11 controlled to be less than the first pass voltage Vpass11 and the second pass voltage Vpass11 is applied to the unselected word lines WL1 to WLk−1 and WLk+1 to WLn, and thus a pass disturb phenomenon occurring in the memory cells MC1 to MCk−1 and MCk+1 to MCn may be suppressed during a read operation.

The threshold voltage of the second auxiliary transistor AT2[k] coupled to the selected auxiliary word line AWLk may be less than or equal to zero volts, corresponding to an erased state. During the evaluation period T12, the second auxiliary transistor AT2[k] may be turned off so that a channel is not formed in the second auxiliary transistor AT2[k] in the erased state. For this operation, during the evaluation period T12, the ground voltage GND or a negative voltage may be supplied, as the second voltage V12, from the voltage supply circuit 30 of FIG. 1 to the selected auxiliary word line AWLk.

During the equalizing period T13 after the evaluation period T12, an equalizing voltage Veq may be applied to each of the selected word line WLk and the selected auxiliary word line AWLk.

The equalizing voltage Veq may be applied so as to reduce the difference between discharge speeds of the plurality of word lines WL1 to WLn and the plurality of auxiliary word lines AWL1 to AWLn during the subsequent discharge period T14. The equalizing voltage Veq may have the same level as the second pass voltage Vpass12.

The read voltage Vr applied to the selected word line WLk may be discharged before the equalizing voltage Veq is applied. The embodiment of the present disclosure is not limited thereto, and the read voltage Vr applied to the selected word line WLk may be maintained until the equalizing voltage Veq is applied.

During the discharge period T14 after the equalizing period T13, the voltages that are applied to the first bit line BL1, the selected word line WLk, the selected auxiliary word line AWLk, the unselected word lines WL1 to WLk−1 and WLk+1 to WLn, and the unselected auxiliary word lines AWL1 to AWLk−1 and AWLk+1 to AWLn may be discharged.

Figure 7:
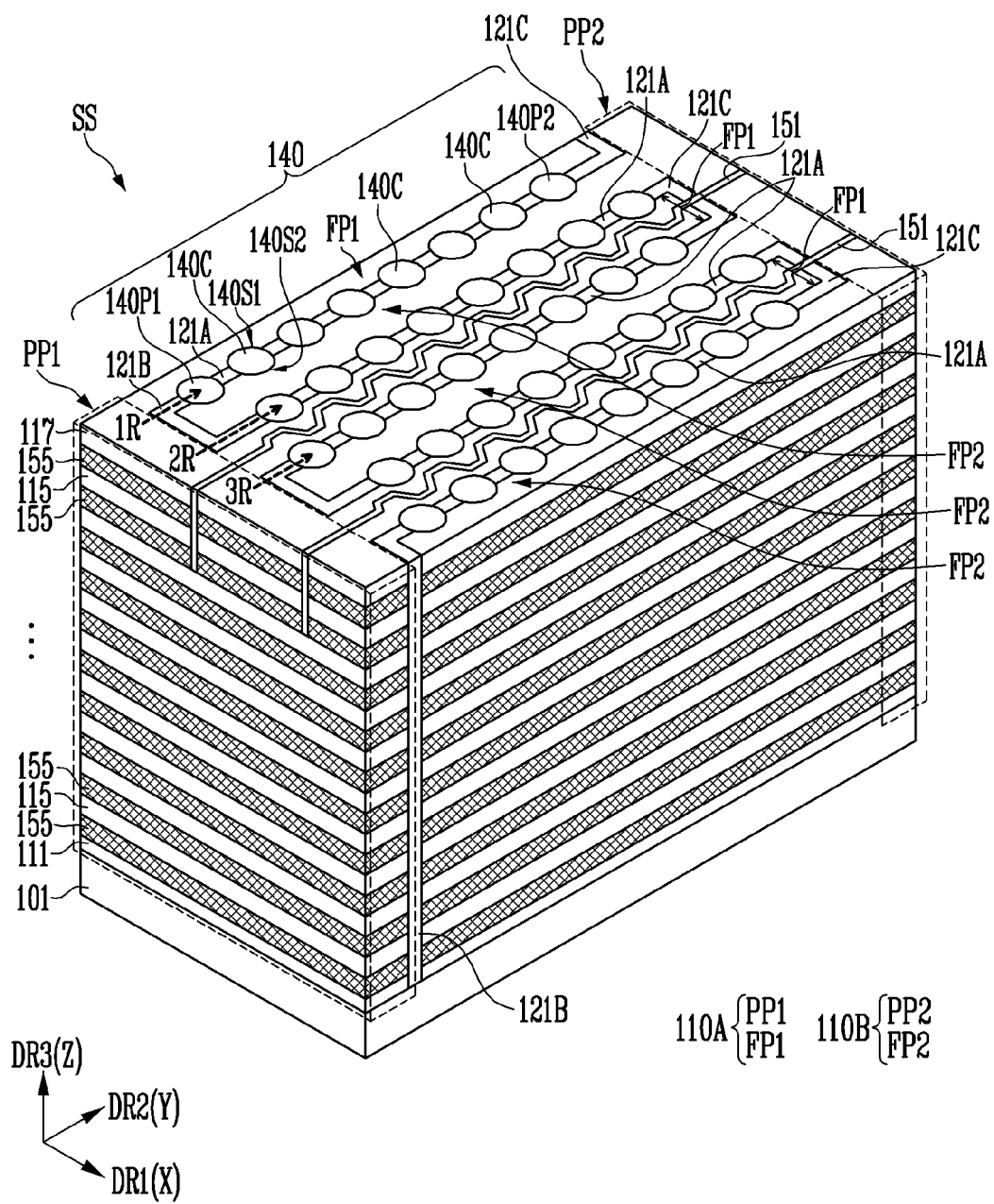
FIGS. 7 and 8 are diagrams illustrating a semiconductor memory device according to an embodiment of the present disclosure.
Figure 8:
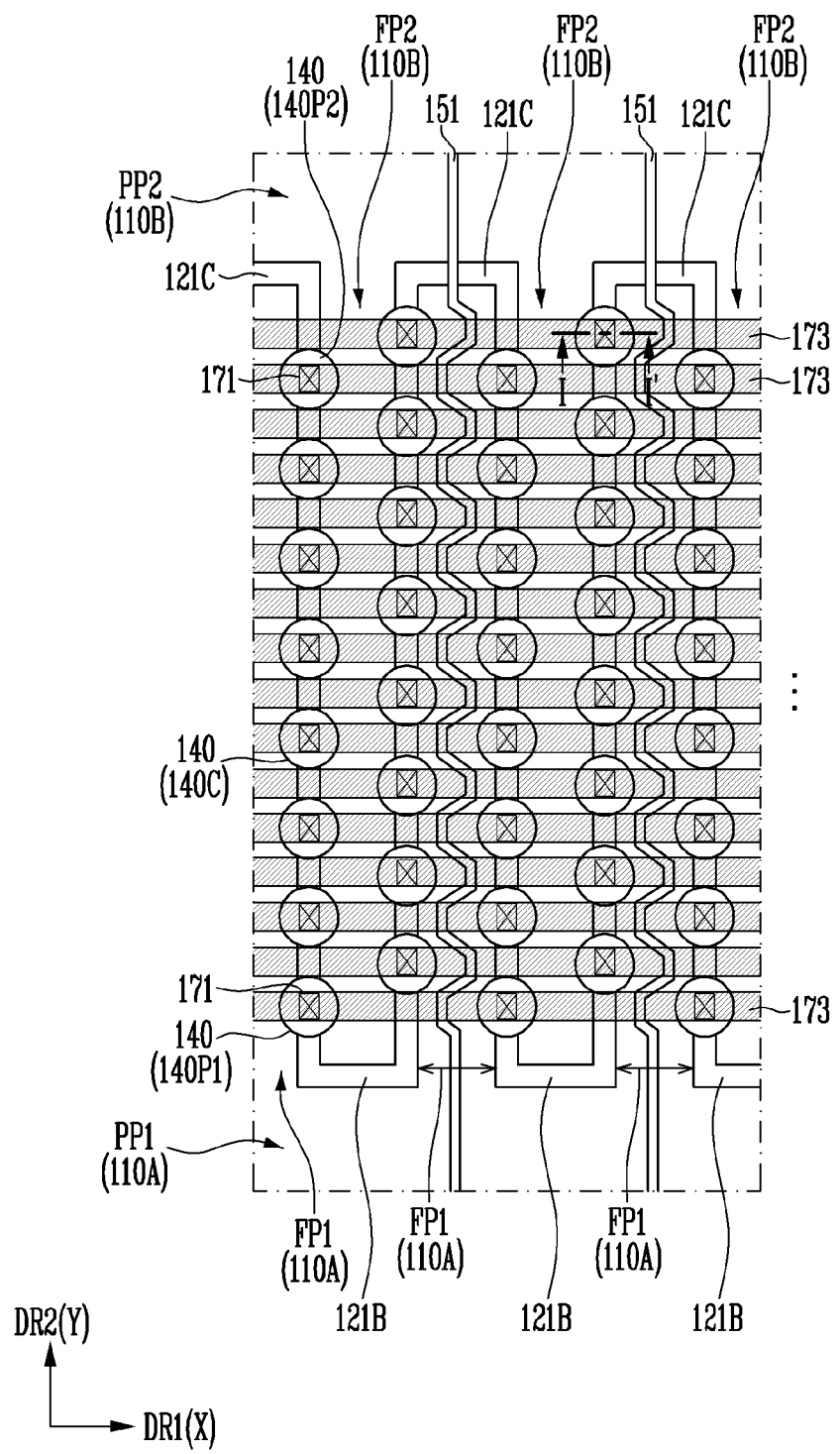

FIGS. 7 and 8 are diagrams illustrating a semiconductor memory device according to an embodiment of the present disclosure. FIG. 7, is a perspective view illustrating an arrangement of a doped semiconductor structure 101, a split structure SS, and a plurality of pillar structures 140 of the semiconductor memory device. FIG. 8 is a plan view illustrating an arrangement of a plurality of bit lines 173 overlapping the structure of FIG. 7.

Referring to FIG. 7, the doped semiconductor structure 101 may be a component corresponding to the doped semiconductor structure DPS of FIG. 3. It may be formed to have a shape substantially the same as a plate extending in a first direction DR1 and an orthogonal second direction DR2. The doped semiconductor structure 101 may include a substantially planar surface the normal of which extends in a third direction DR3, substantially orthogonal to both DR1 and DR2. The first direction DR1, the second direction DR2, and the third direction DR3 are thus mutually orthogonal, extend in corresponding directions that may correspond to an X-axis direction, a Y-axis direction, and a Z-axis direction, respectively, as described above with reference to FIG. 3.

The doped semiconductor structure 101 may include at least one of n-type impurities and p-type impurities. In an embodiment, the doped semiconductor structure 101 may be formed of a doped semiconductor layer including n-type impurities as majority carriers. In an embodiment, the doped semiconductor structure 101 may include a doped semiconductor layer including n-type impurities as majority carriers and a doped semiconductor layer including p-type impurities as majority carriers.

The split structure SS may be disposed on one surface of the doped semiconductor structure 101 facing in the third direction DR3. The split structure SS may include a gate stacked body 110A and an auxiliary gate stacked body 110B.

Referring to FIGS. 7 and 8, the gate stacked body 110A and the auxiliary gate stacked body 110B may be formed to be engaged with each other on the same plane. In an embodiment, the gate stacked body 110A and the auxiliary gate stacked body 110B may be formed to be engaged with each other on an XY plane. More specifically, the gate stacked body 110A may include at least one first finger part FP1 and a first pad part PP1 intersecting the at least one first finger part FP1. The auxiliary gate stacked body 110B may include at least one second finger part FP2 and a second pad part PP2 intersecting the at least one second finger part FP2. Although FIGS. 7 and 8 illustrate three first finger parts FP1 and three second finger parts FP2, the number of first finger parts FP1 and the number of second finger parts FP2 are not limited to those illustrated in the drawing. The first finger parts FP1 and the second finger parts FP2 may be alternately disposed in the first direction DR1. The first finger parts FP1 and the second finger parts FP2 may extend in the second direction DR2. The first pad part PP1 and the second pad part PP2 may extend in the first direction DR1. The first finger parts FP1 and the second finger parts FP2 may be disposed between the first pad part PP1 and the second pad part PP2. The first finger parts FP1 may extend from the first pad part PP1 towards the second pad part PP2, and the second finger parts FP2 may extend from the second pad part PP2 towards the first pad part PP1. When the gate stacked body 110A includes two or more first finger parts FP1, the two or more first finger parts FP1 may be coupled to each other through the first pad part PP1. When the auxiliary gate stacked body 110B includes two or more second finger parts FP2, the two or more second finger parts FP2 may be coupled to each other through the second pad part PP2.

A plurality of pillar structures 140 (or a plurality of substantially pillar-shaped structures 140) and a plurality of first insulating structures 121A may be alternately disposed along geometric lines that extend in the second direction DR2, between the first finger part FP1 and the second finger part FP2 neighboring each other. Each pillar structure 140 may have a first side portion 140S1 contacting the first finger part FP1, and a second side portion 140S2 contacting the second finger part FP2. Each pillar structure 140 may correspond to the pillar structure PS, described above and depicted in FIGS. 4A and 4B.

The plurality of pillar structures 140 may include a first pad-side pillar structure 140P1 adjacent to the first pad part PP1, a second pad-side pillar structure 140P2 adjacent to the second pad part PP2, and a plurality of center pillar structures 140C between the first pad-side pillar structure 140P1 and the second pad-side pillar structure 140P2. A second insulating structure 121B may be disposed between the first pad-side pillar structure 140P1 and the first pad part PP1, and a third insulating structure 121C may be disposed between the second pad-side pillar structure 140P2 and the second pad part PP2. The second insulating structure 121B may contact the first pad-side pillar structure 140P1, and may extend along a boundary between the first pad part PP1 and the second finger part FP2. The third insulating structure 121C may contact the second pad-side pillar structure 140P2, and may extend along a boundary between the second pad part PP2 and the first finger part FP1.

The first to third insulating structures 121A to 121C and the plurality of pillar structures 140 may extend from the doped semiconductor structure 101 in the third direction DR3. The gate stacked body 110A may be structurally separated from the auxiliary gate stacked body 110B through coupling between the first to third insulating structures 121A to 121C and the plurality of pillar structures 140.

The plurality of pillar structures 140 may be arranged in alignment with substantially parallel geometric lines that extend in the second direction DR2, thus forming rows of pillar structures 140. When the gate stacked body 110A of the split structure SS includes two or more first finger parts FP1, or when the auxiliary gate stacked body 110B of the split structure SS includes two or more second finger parts FP2, the plurality of pillar structures 140 may be arranged in two or more substantially parallel rows, respectively. In an embodiment, the plurality of pillar structures 140 may be arranged in a first row 1R, a second row 2R, and a third row 3R, respectively, spaced apart from each other in the first direction DR1. The second row 2R may be defined to be disposed between the first row 1R and the third row 3R. In this case, each of the gate stacked body 110A and the auxiliary gate stacked body 110B may include a finger part contacting the pillar structures in two rows. For example, the auxiliary gate stacked body 110B may include a second finger part FP2 contacting the pillar structure 140 in the first row 1R and the pillar structure 140 in the second row 2R, and the gate stacked body 110A may include a first finger part FP1 contacting the pillar structure 140 in the second row 2R and the pillar structure 140 in the third row 3R.

The gate stacked body 110A and the auxiliary gate stacked body 110B may correspond to the gate stacked body GST and the auxiliary gate stacked body AGST, respectively, illustrated in FIG. 3. Each of the gate stacked body 110A and the auxiliary gate stacked body 110B may include a plurality of insulating layers 111, 115, and 117 and a plurality of conductive layers 155, which are alternately stacked in the third direction DR3.

Each of the insulating layers 111, 115, and 117 may include an insulating material such as silicon oxide. The plurality of insulating layers 111, 115, and 117 may include a first insulating layer 111, a plurality of second insulating layers 115, and a third insulating layer 117. The first insulating layer 111 may be disposed adjacent to the doped semiconductor structure 101. The third insulating layer 117 may be spaced apart from the first insulating layer 111 in the third direction DR3. The plurality of second insulating layers 115 may be disposed between the first insulating layer 111 and the third insulating layer 117, and may be disposed alternately with the plurality of conductive layers 155 in the third direction DR3.

Each of the conductive layers 155 may include at least one of a doped semiconductor layer, a metal layer, and a conductive metal nitride layer. The doped semiconductor layer may include a doped silicon layer. The metal layer may include tungsten, copper, molybdenum, or the like. The conductive metal nitride layer may include titanium nitride, tantalum nitride, or the like. The plurality of conductive layers 155 of the gate stacked body 110A may form the plurality of gate electrodes SSLa, SSLb, WL1 to WLn, DSLa, and DSLb, illustrated in FIG. 3, and the plurality of conductive layers 155 of the auxiliary gate stacked body 110B may form the plurality of auxiliary gate electrodes ASSLa, ASSLb, AWL1 to AWLn, ADSLa, and ADSLb, illustrated in FIG. 3. In detail, among the plurality of conductive layers 155, conductive layers arranged on a layer adjacent to the doped semiconductor structure 101 may be used as the source select lines SSLa and SSLb and the auxiliary source select lines ASSLa and ASSLb illustrated in FIG. 3. The remaining conductive layers may be used as the plurality of word lines WL1 to WLn of FIG. 3, the auxiliary word lines AWL1 to AWLn of FIG. 3, the drain select lines DSLa and DSLb of FIG. 3, and the auxiliary drain select lines ADSLa and ADSLb of FIG. 3.

Each of the insulating layers 111, 115, and 117 and the plurality of conductive layers 155 may be partitioned into the first pad part PP1 and the first finger part FP1 of the gate stacked body 110A and the second pad part PP2 and the second finger part FP2 of the auxiliary gate stacked body 110B through the plurality of pillar structures 140 and the first to third insulating structures 121A to 121C. When the gate stacked body 110A includes a first finger part contacting the pillar structures in two rows, the split structure 151 may be disposed in the first finger part contacting the pillar structures in the two rows. For example, the split structure 151 may be disposed in the first finger part FP1 contacting the pillar structure 140 in the second row 2R and the pillar structure 140 in the third row 3R. The split structure 151 may extend along the second direction DR2 between the second row 2R and the third row 3R and may extend into the first pad part PP1 and the second pad part PP2. The split structure 151 may be formed to be shorter than the first to third insulating structures 121A to 121C in the third direction DR3. In detail, the split structure 151 may be formed at a depth at which the conductive layer used as a drain select line, among the conductive layers 155, is penetrated. The split structure 151 may be formed of an insulating material. The conductive layer penetrated by the split structure 151 may be split into a drain select line for controlling the pillar structure in the second row 2R and a drain select line for controlling the pillar structure in the third row 3R. The split structure 151 may be formed in various structures having various shapes, such as zigzagged, crenate, crenallated or boustrophedonic, a wave shape or a linear shape, on a plane (e.g., an XY plane).

Referring to FIG. 8, conductive contact structures 171 may overlap respective pillar structures 140. Each of the conductive contact structures 171 may correspond to the first conductive contact structure CT1 or the second conductive contact structure CT2 illustrated in FIG. 3.

Bit lines 173 may be spaced apart from the gate stacked body 110A and the auxiliary gate stacked body 110B with the conductive contact structures 171 interposed therebetween. The bit lines 173 may extend in the first direction DR1. Each of the bit lines 173 may correspond to the first bit line BL1 or the second bit line BL2, illustrated in FIG. 3.

Figure 9:
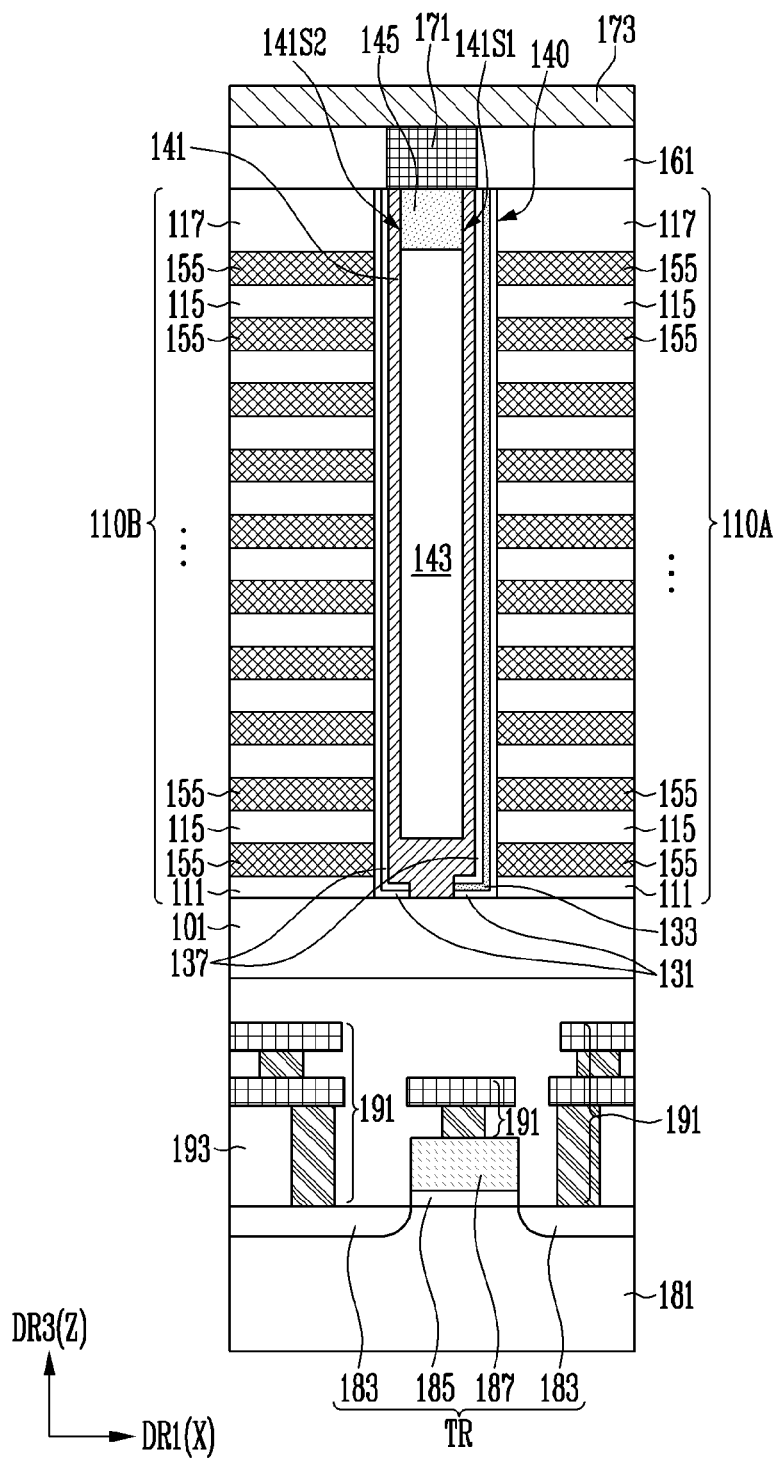

FIGS. 9 and 10 are sectional views of a semiconductor memory device according to embodiments of the present disclosure. Respective sectional views illustrated in FIGS. 9 and 10 may correspond to sectional views of the semiconductor memory device taken along line I-I' of FIG. 8. Hereinafter, repeated descriptions of a configuration identical to that of FIG. 8 will be omitted.

As shown in FIGS. 9 and 10, which depict a pillar structure cross-section, the pillar structure 140 may include a blocking insulating layer 131, a data storage layer 133, a tunnel insulating layer 137, a channel layer 141, and a core insulating layer 143, as described above with reference to FIGS. 4A and 4B. In FIGS. 9 and 10, the blocking insulating layer 131, the data storage layer 133, the tunnel insulating layer 137, the channel layer 141, and the core insulating layer 143, which correspond to the pillar structure illustrated in FIG. 4B, are representatively illustrated.

Each of the blocking insulating layer 131, the data storage layer 133, the tunnel insulating layer 137, the channel layer 141, and the core insulating layer 143 may extend from the doped semiconductor structure 101 in the third direction DR3. The channel layer 141 may include a first side portion 141S1 facing the gate stacked body 110A and a second side portion 141S2 facing the auxiliary gate stacked body 110B, and may contact the doped semiconductor structure 101.

The plurality of insulating layers 111, 115, and 117 and the plurality of conductive layers 155 of the gate stacked body 110A may be stacked along the first side portion 141S1 of the channel layer 141 in the third direction DR3. The plurality of insulating layers 111, 115, and 117 and the plurality of conductive layers 155 of the auxiliary gate stacked body 110B may be stacked along the second side portion 141S2 of the channel layer 141 in the third direction DR3.

The blocking insulating layer 131 may contact at least one of the first to third insulating structures 121A to 121C illustrated in FIGS. 7 and 8. The channel region of the auxiliary string may be defined in the second side portion 141S2 of the channel layer 141. The data storage layer 133 is cut to open the second side portion 141S2 of the channel layer 141, whereby a phenomenon in which a potential varies in the channel region of the auxiliary string due to charges stored in the data storage layer 133 may be suppressed.

The pillar structure 140 may further include a capping semiconductor layer 145. The capping semiconductor layer 145 may be formed of a semiconductor material including at least one of n-type impurities and p-type impurities. In an embodiment, the capping semiconductor layer 145 may include n-type impurities as majority carriers.

The end of the channel layer 141 adjacent to the capping semiconductor layer 145 may be doped with impurities diffused from the capping semiconductor layer 145, and the end of the channel layer 141 adjacent to the doped semiconductor structure 101 may be doped with impurities diffused from the doped semiconductor structure 101. The channel layer 141 may extend in the third direction DR3 to enclose a sidewall of the capping semiconductor layer 145.

The end of the channel layer 141 adjacent to the doped semiconductor structure 101 may penetrate the blocking insulating layer 131, the data storage layer 133, and the tunnel insulating layer 137 and may contact the doped semiconductor structure 101.

Referring to FIG. 9, at least one of the blocking insulating layer 131, the data storage layer 133, and the tunnel insulating layer 137 may include a bent portion interposed between the doped semiconductor structure 101 and the channel layer 141.

Referring to FIG. 10, the end of the channel layer 141 adjacent to the doped semiconductor structure 101 may protrude longer than the blocking insulating layer 131, the data storage layer 133, and the tunnel insulating layer 137 towards the doped semiconductor structure 101, and may be embedded in the doped semiconductor structure 101.

Referring to FIGS. 9 and 10, the gate stacked body 110A and the auxiliary gate stacked body 110B may overlap the doped semiconductor structure 101. A bit line 173 may overlap the doped semiconductor structure 101 with the gate stacked body 110A and the auxiliary gate stacked body 110B interposed therebetween.

The bit line 173 may be disposed on a first intervening insulating layer 161. The first intervening insulating layer 161 may extend to cover the gate stacked body 110A and the auxiliary gate stacked body 110B. The first intervening insulating layer 161 may be penetrated by a conductive contact structure 171. The conductive contact structure 171 may contact the first side portion 141S1 and the second side portion 141S2 of the channel layer 141 and extend towards the bit line 173 in the third direction DR3. The first side portion 141S1 and the second side portion 141S2 of the channel layer 141 may be coupled to the same bit line 173 via the conductive contact structure 171. The conductive contact structure 171 may be omitted in some cases. In this case, the bit line 173 may directly contact the first side portion 141S1 and the second side portion 141S2 of the channel layer 141 and the capping semiconductor layer 145.

The semiconductor memory device may include a semiconductor substrate 181 and a plurality of transistors TR forming the peripheral circuit 40 illustrated in FIG. 1. The semiconductor substrate 181 may provide junctions 183 as source regions and drain regions of respective transistors TR. The semiconductor substrate 181 may be formed of silicon, silicon-germanium, germanium, monocrystalline silicon, a monocrystalline epitaxial layer, or the like.

Each transistor TR may include a gate insulating layer 185 and a gate electrode 187 stacked on one surface of the semiconductor substrate 181. The junctions 183 of each transistor TR may be formed in the semiconductor substrate 181 on both sides of the gate electrode 187, and may be defined as regions into which at least one of n-type impurities and p-type impurities is implanted.

The transistor TR and the semiconductor substrate 181 may be covered with a peripheral circuit-side insulating structure 193. The peripheral circuit-side insulating structure 193 may include insulating layers implemented as two or more layers.

Each transistor TR may be coupled to an interconnection 191. The interconnection 191 may include sub-conductive patterns implemented as two or more layers. The interconnection 191 may be disposed in the peripheral circuit-side insulating structure 193.

Referring to FIG. 9, the transistor TR and the semiconductor substrate 181 may be disposed adjacent to the doped semiconductor structure 101. The peripheral circuit-side insulating structure 193 may extend to a space between the interconnection 191 and the doped semiconductor structure 101. Although not illustrated in the drawing, the semiconductor memory device may further include a conductive vertical contact. The conductive vertical contact (not illustrated) may be coupled to the interconnection 191, and may then extend in the third direction DR3 to penetrate the peripheral circuit-side insulating structure 193. The interconnection 191 may be coupled to any one of the plurality of conductive layers 155 and the bit line 173 via the conductive vertical contact (not illustrated).

Referring to FIG. 10, the transistor TR and the semiconductor substrate 181 may be disposed adjacent to the bit line 173. Here, a second intervening insulating layer 179 and a third intervening insulating layer 197 may be disposed between the peripheral circuit-side insulating structure 193 and the bit line 173. The second intervening insulating layer 179 may be disposed adjacent to the bit line 173, and the third intervening insulating layer 197 may be disposed adjacent to the peripheral circuit-side insulating structure 193.

A first contact plug 177 and a first conductive bonding pad BP1 may be disposed in the second intervening insulating layer 179. The first contact plug 177 and the first conductive bonding pad BP1 may be coupled to any one of the plurality of conductive layers 155 and the bit line 173. In an embodiment, the bit line 173 may be coupled to the first conductive bonding pad BP1 via the first contact plug 177.

A second contact plug 195 and a second conductive bonding pad BP2 may be disposed in the third intervening insulating layer 197. The second contact plug 195 and the second conductive bonding pad BP2 may be coupled to the interconnection 191. In an embodiment, the interconnection 191 coupled to one of the junctions 183 of the transistor TR may be coupled to a second conductive bonding pad BP2 via the second contact plug 195.

The pillar structure 140, the gate stacked body 110A, the auxiliary gate stacked body 110B, the first intervening insulating layer 161, the conductive contact structure 171, the bit line 173, the second intervening insulating layer 179, the first contact plug 177, and the first conductive bonding pad BP1 may form a first structure. The semiconductor substrate 181, the transistor TR, the peripheral circuit-side insulating structure 193, the interconnection 191, the third intervening insulating layer 197, the second contact plug 195, and the second conductive bonding pad BP2 may form a second structure. The above-described first structure and second structure may be provided through separate processes. Thereafter, the first structure and the second structure may undergo a bonding process so that the first conductive bonding pad BP1 and the seconded conductive bonding pad BP2 are coupled to each other, and thus the first structure and the second structure may be electrically and structurally connected to each other. The doped semiconductor structure 101 may be formed after the above-described bonding process.

The first conductive bonding pad BP1 and the second conductive bonding pad BP2 may include metal enabling bonding therebetween. In an embodiment, the first conductive bonding pad BP1 and the second conductive bonding pad BP2 may include metal such as copper or a copper alloy.

FIGS. 11A to 11G illustrate a method of manufacturing a semiconductor memory device according to an embodiment of the present disclosure.

Figure 11A:
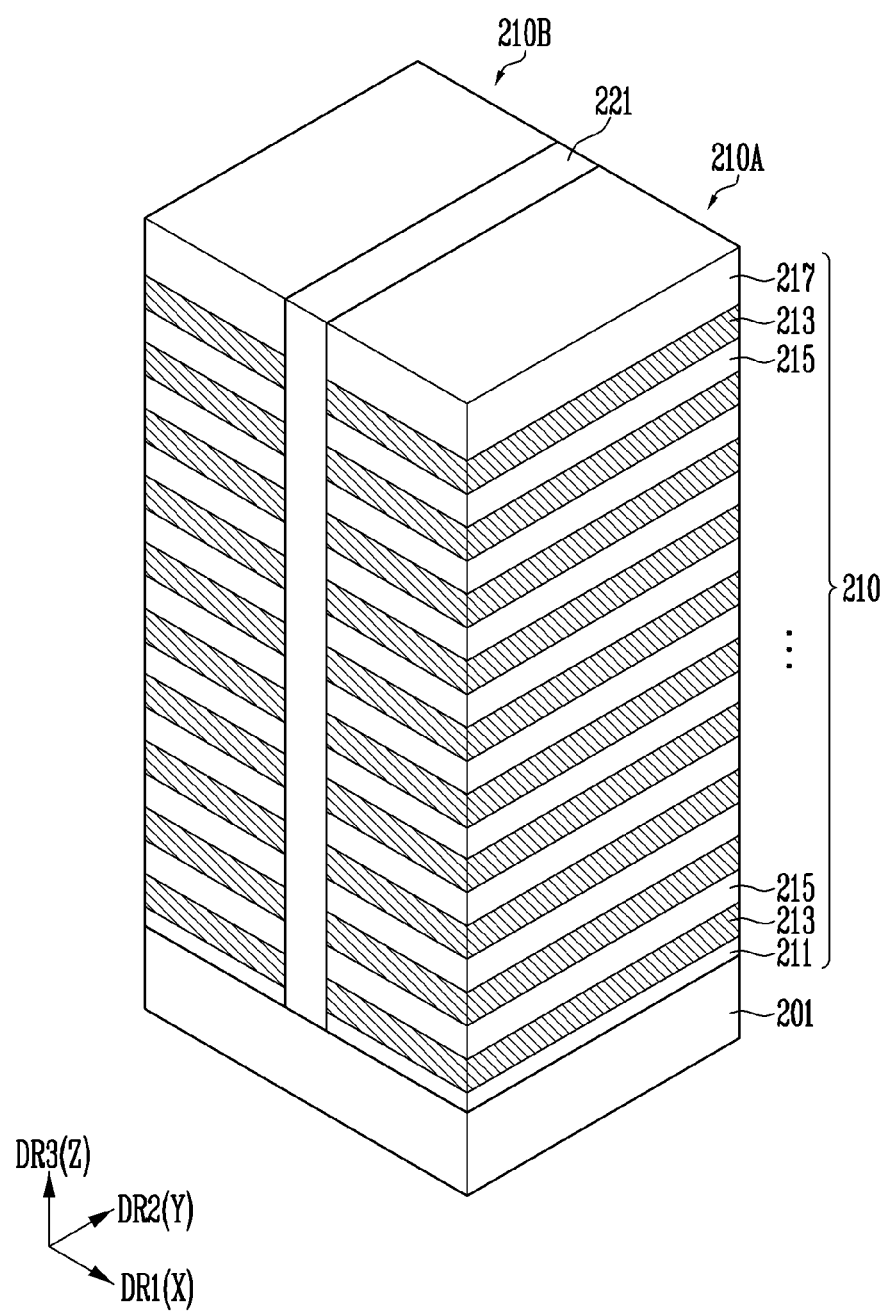
FIGS. 11A to 11G illustrate a method of manufacturing a semiconductor memory device according to an embodiment of the present disclosure.

Referring to FIG. 11A, a stacked body 210 may be formed on a lower structure 201. In an embodiment, the lower structure 201 may be provided as the doped semiconductor structure 101 illustrated in FIG. 7. Here, the lower structure 201 in FIG. 11A, may be formed on a structure including a semiconductor substrate such as the semiconductor substrate 181 depicted in FIG. 9. That substrate 181 "supports" transistor TR, interconnection 191, and the peripheral circuit-side insulating structure 193. In a different embodiment, the lower structure 201 may be a sacrificial substrate, or it may include a sacrificial substrate and an etch stop layer on the sacrificial substrate. The sacrificial substrate and the etch stop layer may be provided in a process of forming the semiconductor memory device illustrated in FIG. 10. Hereinafter, the manufacturing method according to the present disclosure will be described based on an embodiment in which the lower structure 201 is provided as a doped semiconductor.

The lower structure 201 may be formed in the shape of a plate extending in a first direction DR1 and an orthogonal second direction DR2. The lower structure 201 may include a substantially planar surface having a normal that extends in a third direction DR3 that is orthogonal to both DR1 and DR2. The first direction DR1, the second direction DR2, and the third direction DR3 are mutually orthogonal and may be defined as an X-axis direction, a Y-axis direction, and a Z-axis direction, respectively, as described above with reference to FIG. 3.

The stacked body 210 may include a plurality of first material layers and a plurality of second material layers that are alternately stacked on the lower structure 201 in the third direction DR3. In an embodiment, the plurality of first material layers may be provided as a plurality of insulating layers 211, 215, and 217, and the plurality of second material layers may be provided as a plurality of sacrificial layers 213 having an etch selectivity with respect to the plurality of first material layers. In this case, each of the first material layers may include an insulating material such as silicon oxide, and each of the second material layers may be formed of silicon nitride. In an embodiment, the plurality of first material layers may be provided as the plurality of insulating layers 211, 215, and 217, and the plurality of second material layers may be provided as a plurality of conductive layers. Each of the second material layers may include at least one of a doped semiconductor layer, a metal layer, and a conductive metal nitride layer. Hereinafter, the method of manufacturing a semiconductor memory device will be described based on an embodiment in which the plurality of first material layers are provided as the plurality of insulating layers 211, 215, and 217, and the plurality of second material layers may be provided as the plurality of sacrificial layers 213.

Subsequently, a preliminary insulating structure 221 penetrating the stacked body 210 may be formed. The stacked body 210 may be split into a preliminary gate stacked body 210A and a preliminary auxiliary gate stacked body 210B by the preliminary insulating structure 221.

Figure 11B:
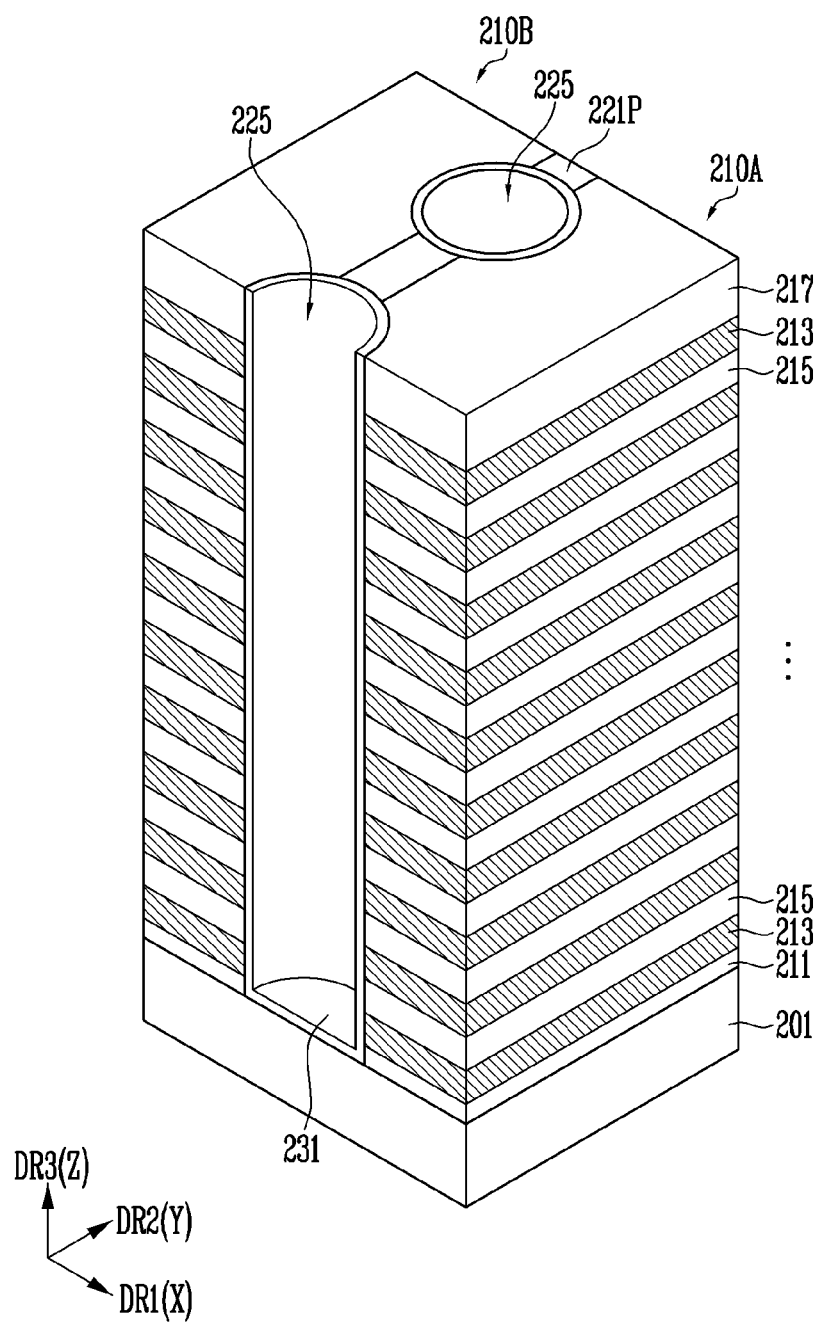

Referring to FIG. 11B, a plurality of holes 225 passing through a portion of the preliminary insulating structure 221 illustrated in FIG. 11A may be formed. Each hole 225 may have a substantially tube shape or cylinder shape. FIG. 11B shows a first hole and a second hole. The second hole is shown in a cut away view. The holes 225, or portions of them, may extend into and through layers forming the preliminary gate stacked body 210A, which is adjacent to the preliminary insulating structure 221 illustrated in FIG. 11A. The holes 225, or portions thereof may also extend into the preliminary auxiliary gate stacked body 210B adjacent to the preliminary insulating structure 221 illustrated in FIG. 11A. In other words, each hole 225 may include a first portion partially passing through the preliminary gate stacked body 210A and a second portion opposite to and a mirror image of the first portion, also partially passing through the preliminary auxiliary gate stacked body 210B. The first portion and the second portion may have substantially Quonset-shape.

The plurality of holes 225 may be arranged to be substantially parallel to each other in the third direction DR3 and spaced apart from each other in the second direction DR2. The plurality of holes 225 may be spaced apart evenly. The preliminary insulating structure 221 illustrated in FIG. 11A may be split into a plurality of insulating structures 221P by the plurality of holes 225.

Subsequently, a blocking insulating layer 231 may be formed along the surface of each hole 225. The blocking insulating layer 231 may contact the insulating structure 221P.

Figure 11C:
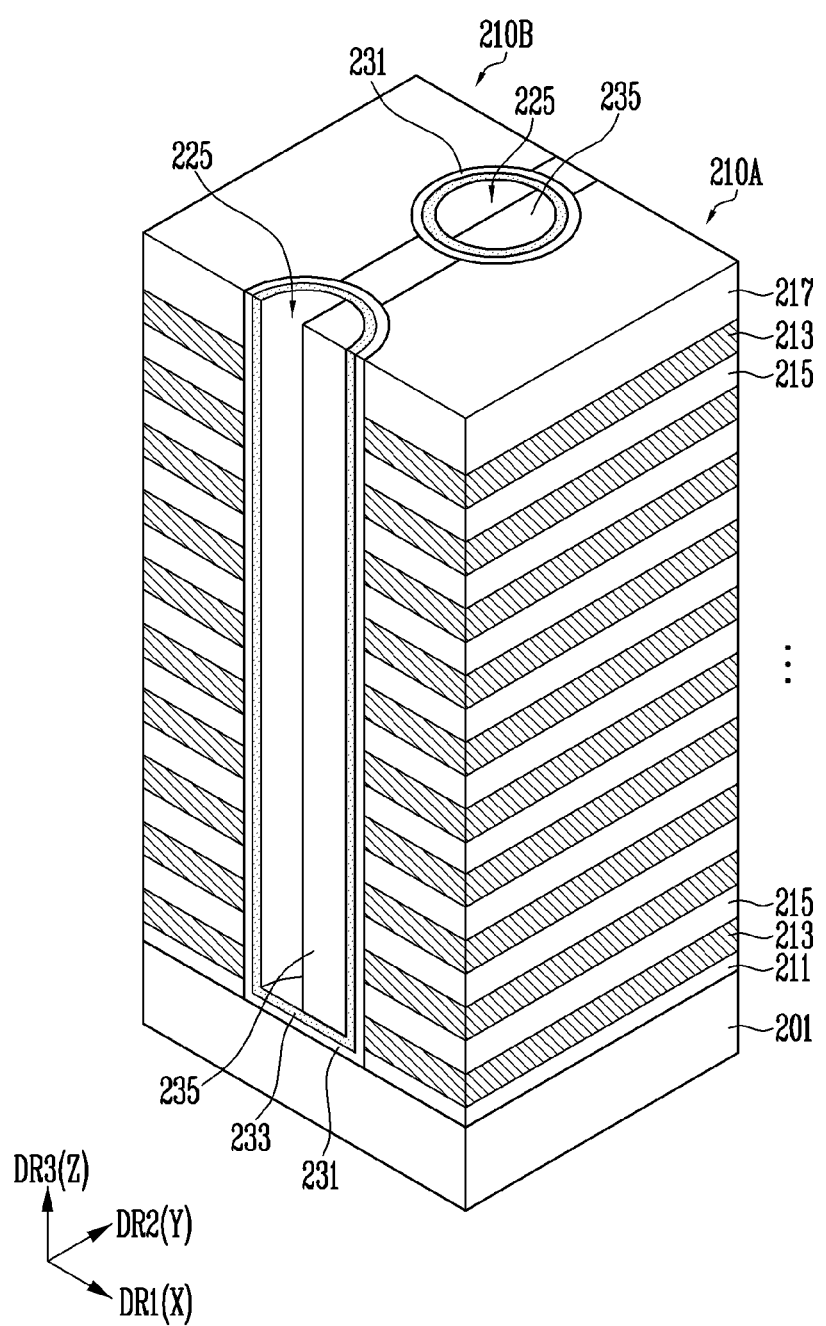

Referring to FIG. 11C, a data storage layer 233 may be formed along the surface of the blocking insulating layer 231 in each hole 225. Thereafter, a mask layer 235 may be formed in a portion of the hole 225 opened by the data storage layer 233. The mask layer 235 may be patterned using a photolithography process. The mask layer 235 may remain inside a portion of the hole 225 adjacent to the preliminary gate stacked body 210A, and may be patterned so that another portion of the hole adjacent to the preliminary auxiliary gate stacked body 210B is opened.

Figure 11D:
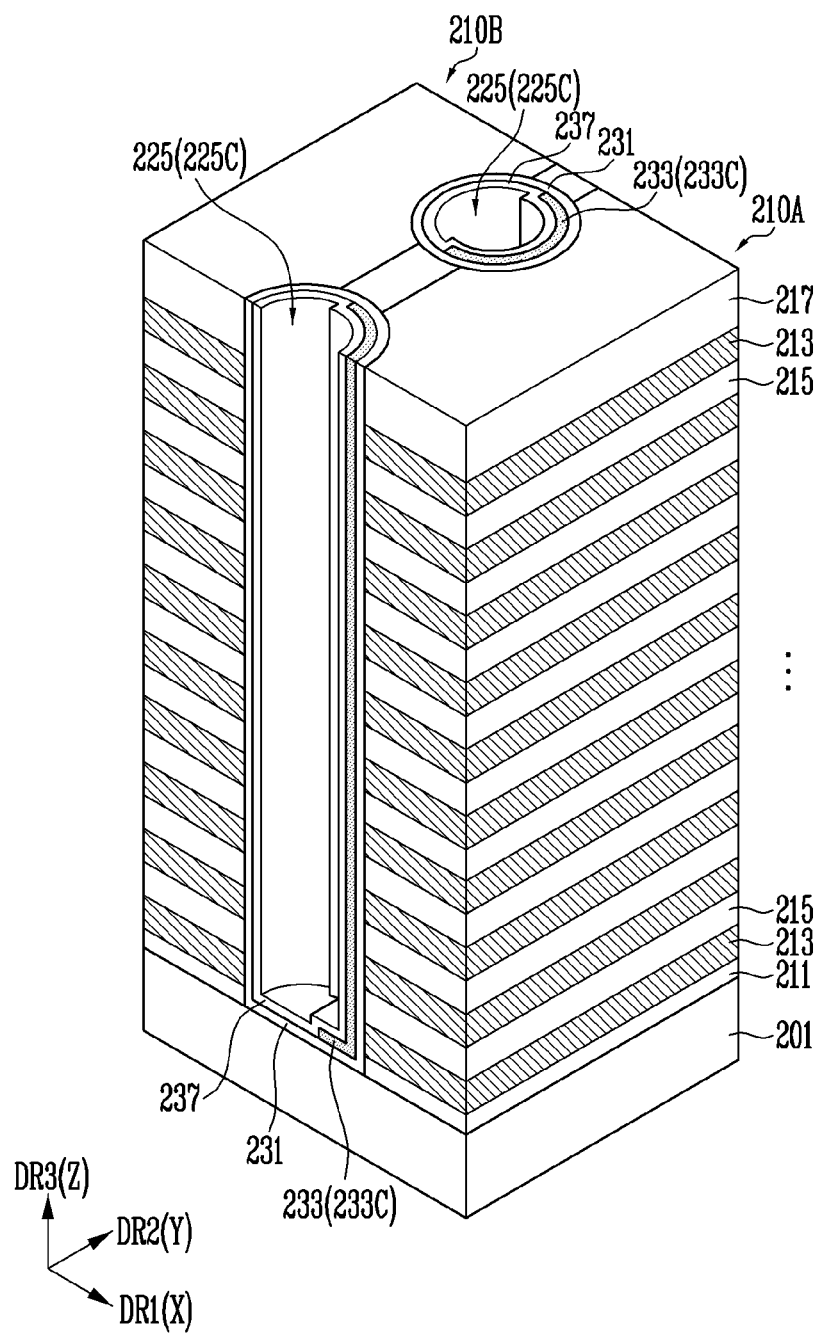

Referring to FIG. 11D, a portion of the data storage layer 233 may be removed through an etching process that uses the mask layer 235 of FIG. 11C as an etching barrier. In this way, the data storage layer 233 may be cut to have a structure of covering a portion of the blocking insulating layer 231 adjacent to the preliminary gate stacked body 210A and to expose another portion of the blocking insulating layer 231 adjacent to the preliminary auxiliary gate stacked body 210B. Hereinafter, the remaining data storage layer 233 is referred to as a "cut data storage layer 233C."

Next, the mask layer 235 illustrated in FIG. 11C may be selectively removed. Thereafter, a tunnel insulating layer 237 may be formed along the surface of the cut data storage layer 233C and the surface of a portion of the blocking insulating layer 231 exposed by the cut data storage layer 233C. A central region 225C of the hole 225 may be opened by the tunnel insulating layer 237.

Figure 11E:
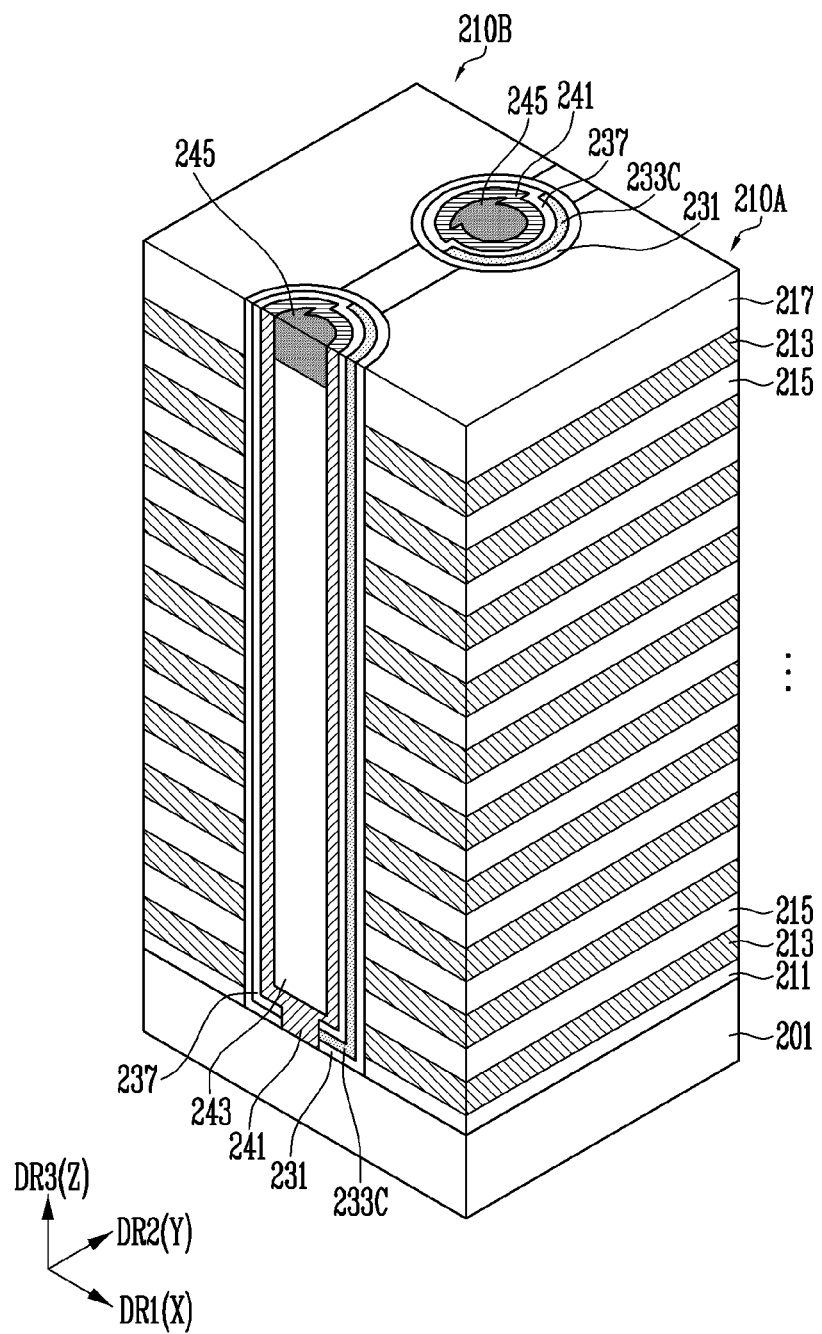

Referring to FIG. 11E, a channel layer 241 may be formed in the central region 225C of the hole 225, illustrated in FIG. 11D. The channel layer 241 may contact the lower structure 201 by penetrating at least one of the cut data storage layer 233C, the blocking insulating layer 231, and the tunnel insulating layer 237. The channel layer 241 may be formed in a hollow shape. The central region having the hollow structure defined by the channel layer 241 may be filled with the core insulating layer 243 and the capping semiconductor layer 245.

Figure 11F:
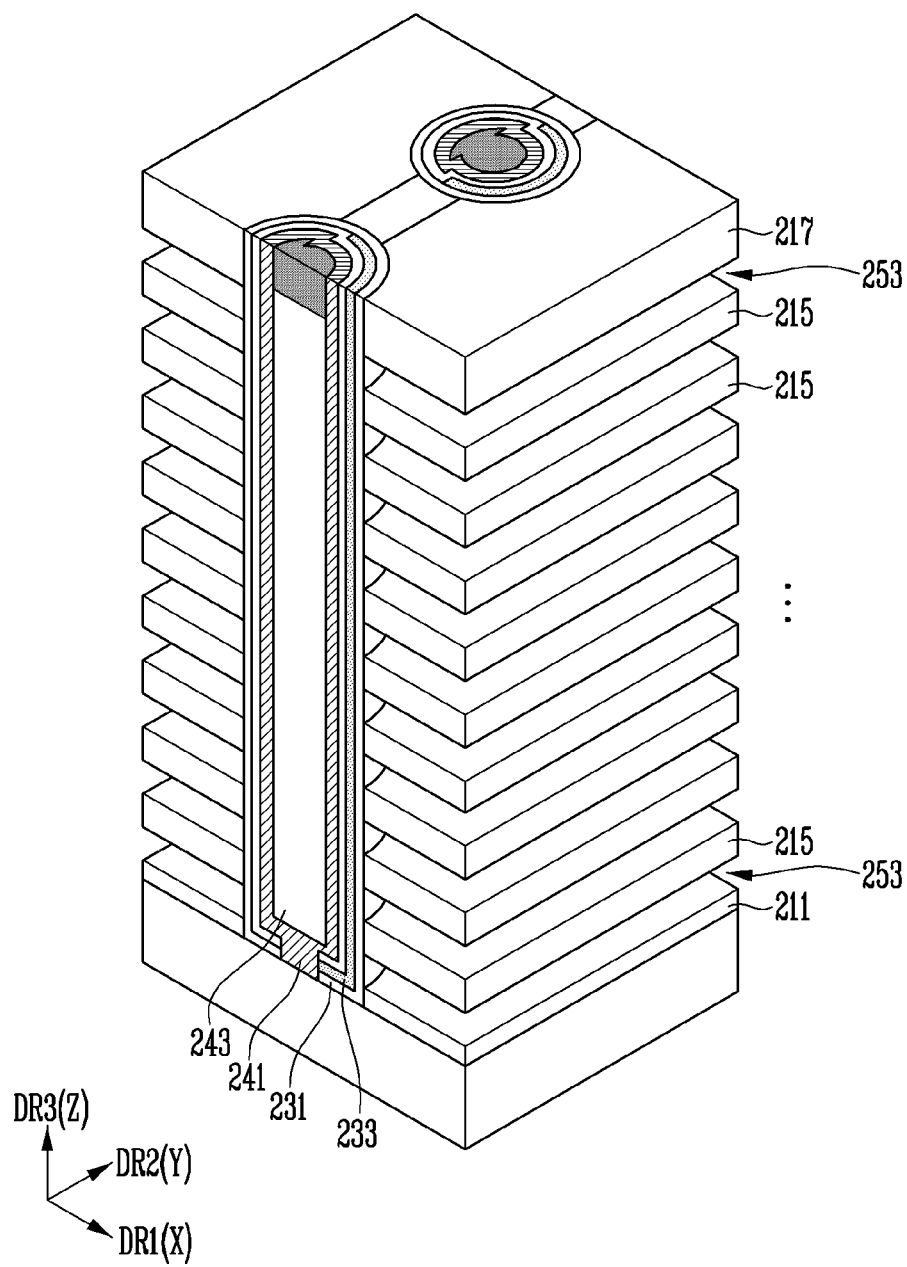

Referring to FIG. 11F, the plurality of sacrificial layers 213 of the preliminary gate stacked body 210A and the preliminary auxiliary gate stacked body 210B illustrated in FIG. 11E may be removed. In this way, a plurality of horizontal spaces 253 may be opened between the plurality of insulating layers 211, 215, and 217. Although not illustrated in the drawing, slits may be formed to pass through the preliminary gate stacked body 210A and the preliminary auxiliary gate stacked body 210B illustrated in FIG. 11E. The plurality of sacrificial layers 213 illustrated in FIG. 11E may be removed through the slits after forming the slits.

Figure 11G:
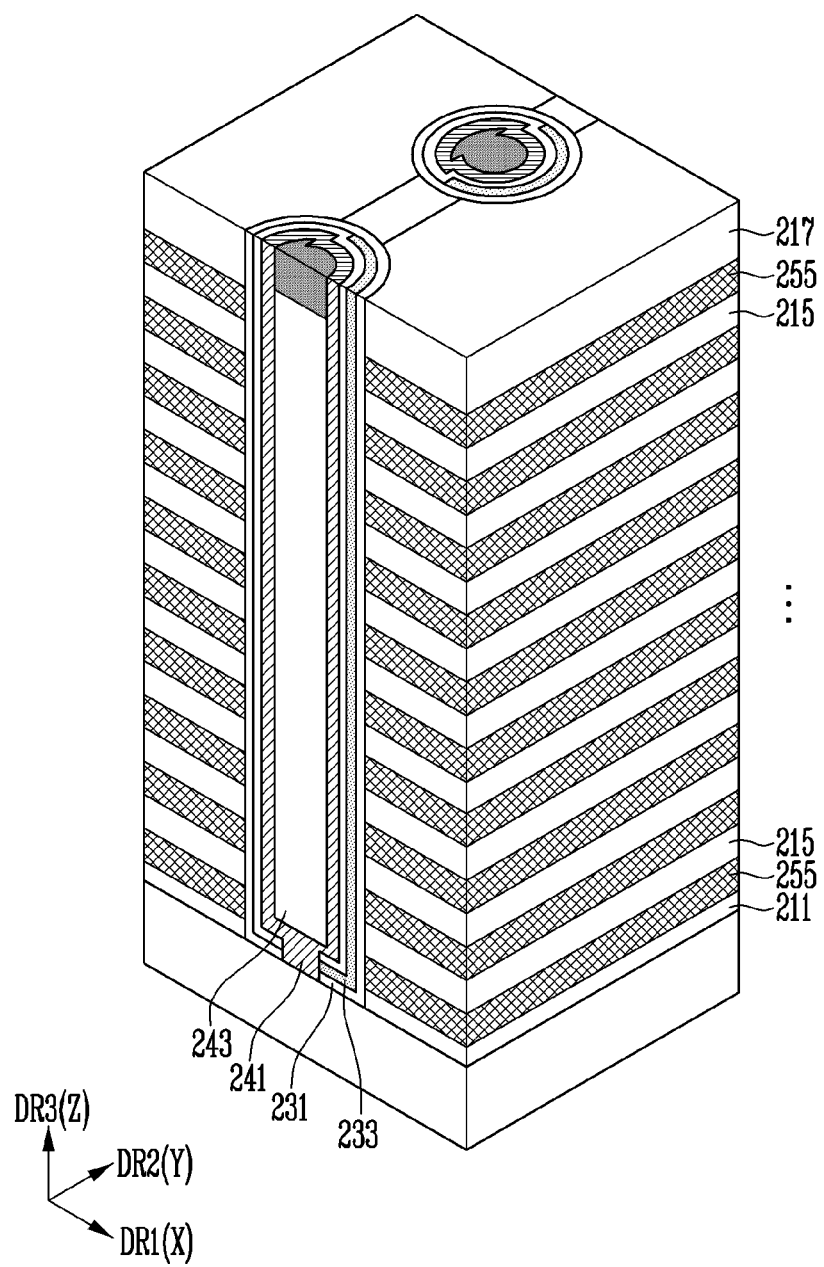

Referring to FIG. 11G, a plurality of conductive layers 255 may be respectively formed in the plurality of horizontal spaces 253 illustrated in FIG. 11F. After the plurality of conductive layers 255 are formed, the split structure 151 described above with reference to FIG. 7 may be formed, and thus the gate stacked body and the auxiliary gate stacked body according to an embodiment of the present disclosure may be provided.

Figure 12A:
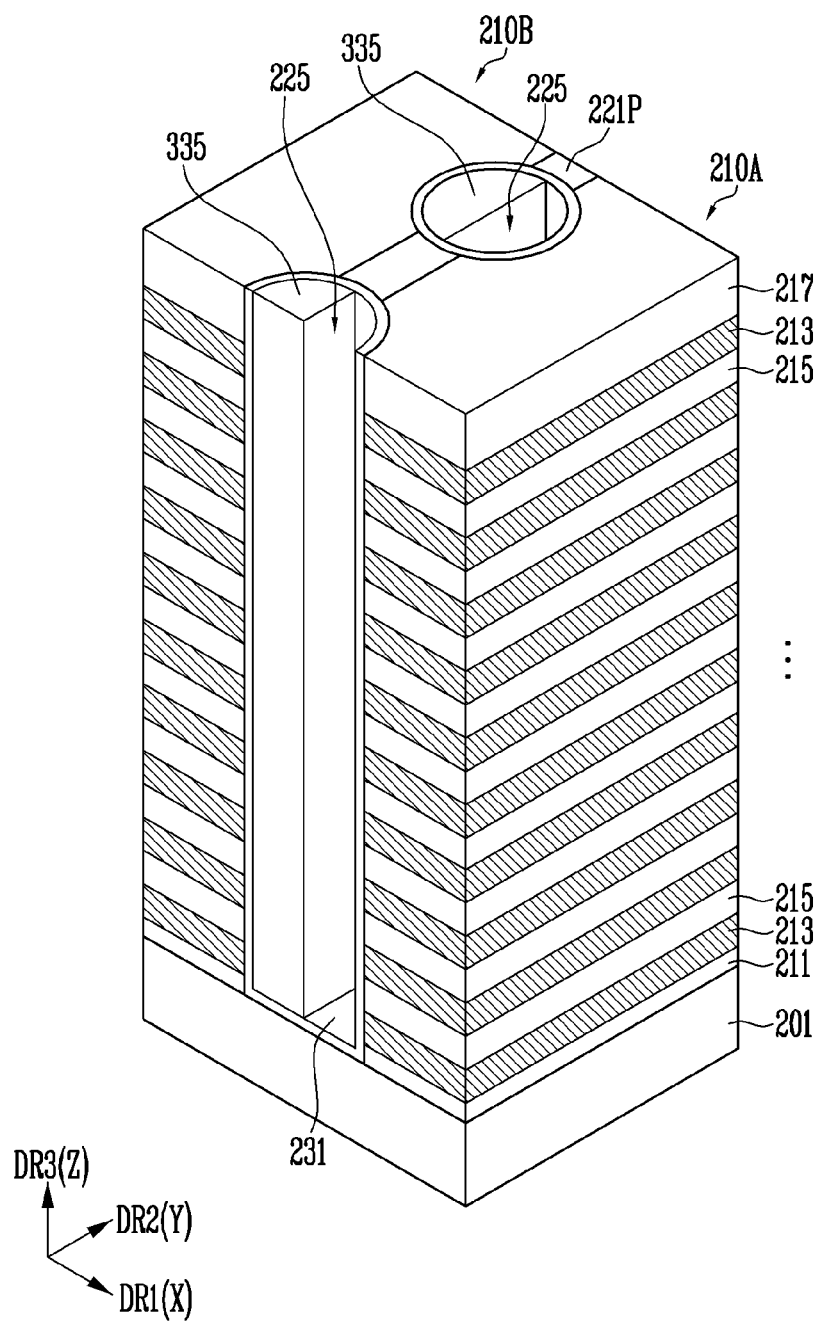
FIGS. 12A and 12B illustrate a method of manufacturing a semiconductor memory device according to an embodiment of the present disclosure.
Figure 12B:
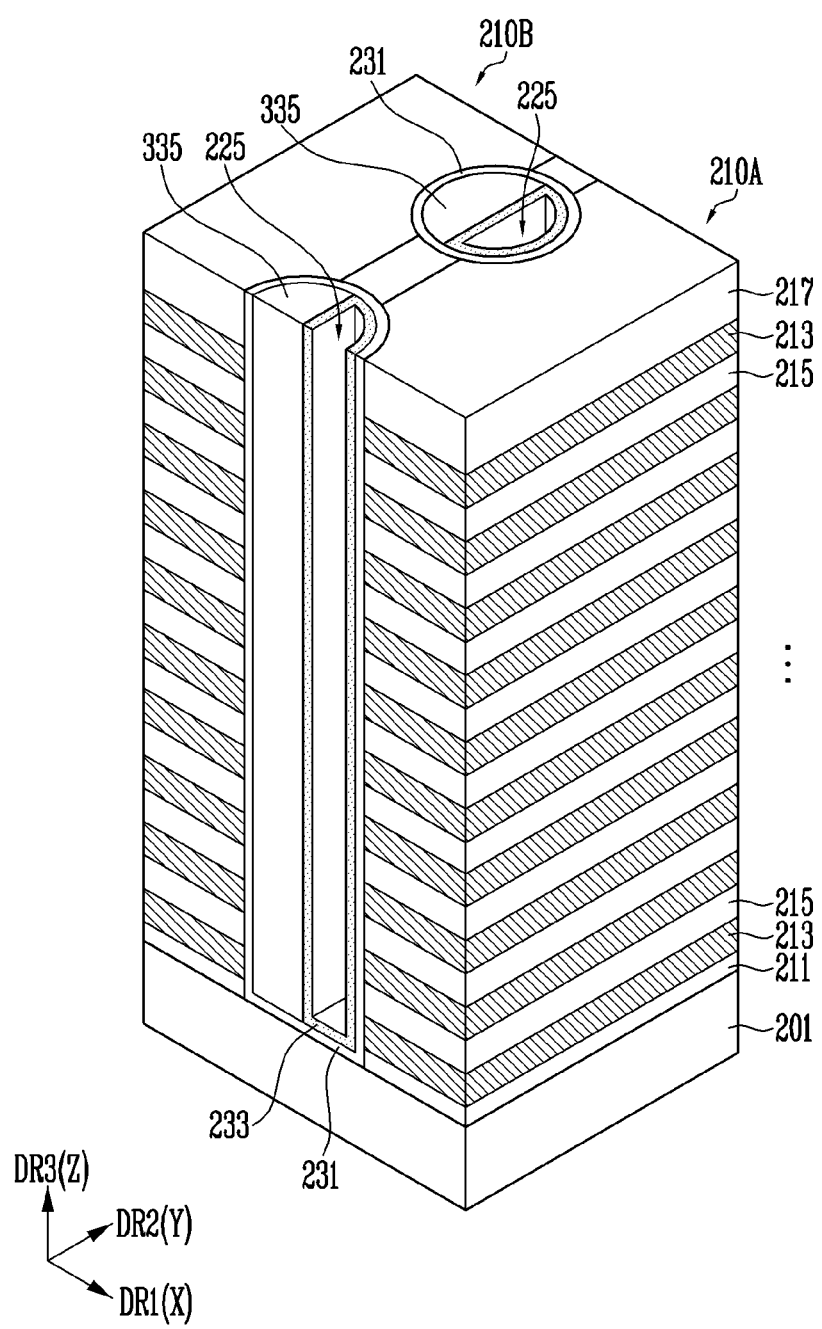

FIGS. 12A and 12B illustrate a method of manufacturing a semiconductor memory device according to an embodiment of the present disclosure. Hereinafter, repeated descriptions of processes identical to those described above with reference to FIGS. 11A to 11G will be omitted.

Referring to FIG. 12A, through the use of the processes described above with reference to FIGS. 11A and 11B, a stacked body including a plurality of insulating layers 211, 215, and 217 and a plurality of sacrificial layers 213 may be formed on a lower structure 201, and a plurality of holes 225 and a plurality of insulating structures 221P passing through the stacked body may be formed. The stacked body may be split into a preliminary gate stacked body 210A and a preliminary auxiliary gate stacked body 210B by the plurality of holes 225 and the plurality of insulating structures 221P.

Subsequently, a blocking insulating layer 231 may be formed, as described above with reference to FIG. 11B. Thereafter, a mask layer 335 may be formed in a portion of each hole 225 opened by the blocking insulating layer 231. The mask layer 335 may be patterned using a photolithography process. The mask layer 335 may remain inside a portion of the hole 225 adjacent to the preliminary auxiliary gate stacked body 210B, and may be patterned such that another portion of the hole 225 adjacent to the preliminary gate stacked body 210A is opened.

Referring to FIG. 12B, a data storage layer 233 may be formed along the surface of the mask layer 335 and the surface of the blocking insulating layer 231 exposed by the mask layer 335. Subsequently, the mask layer 335 illustrated in FIG. 12B may be removed, and a portion of the data storage layer 233 formed along the surface of the mask layer 335 may be removed. By means of this, as illustrated in FIG. 11D, the cut data storage layer 233C may be provided. Subsequent processes may be same as those described above with reference to FIGS. 11D to 11G.

Figure 13:
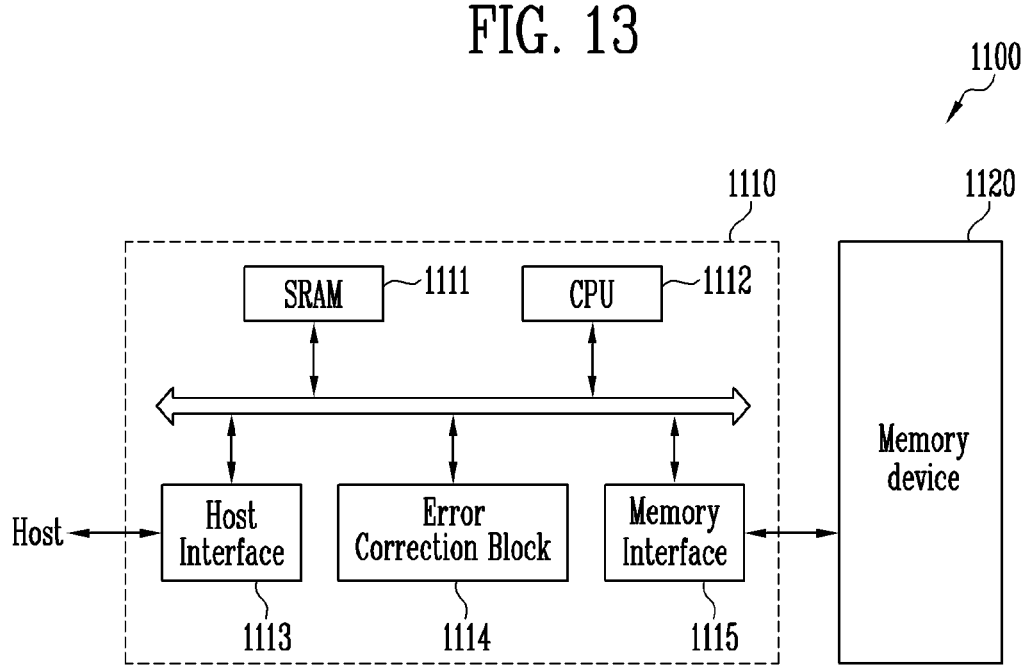
FIG. 13 is a block diagram illustrating the configuration of a memory system according to an embodiment of the present disclosure.

FIG. 13 is a block diagram illustrating the configuration of a memory system according to an embodiment of the present disclosure.

Referring to FIG. 13, a memory system 1100 includes a memory device 1120 and a memory controller 1110.

The memory device 1120 may be a multi-chip package composed of a plurality of flash memory chips. The memory device 1120 may include cell strings and auxiliary strings coupled to each other through a channel layer coupled to a bit line. Each cell string may include a plurality of memory cells stacked along a first side portion of the channel layer, and each auxiliary string may include a plurality of auxiliary transistors stacked along a second side portion of the channel layer.

The memory controller 1110 may control the memory device 1120, and may include static random access memory (SRAM) 1111, a central processing unit (CPU) 1112, a host interface 1113, an error correction block 1114, and a memory interface 1115. The SRAM 1111 may be used as a working memory of the CPU 1112, the CPU 1112 may perform overall control operations for data exchange of the memory controller 1110, and the host interface 1113 may be provided with a data exchange protocol of a host coupled to the memory system 1100. The error correction block 1114 may detect errors included in data read from the memory device 1120, and may correct the detected errors. The memory interface 1115 may interface with the memory device 1120. The memory controller 1110 may further include read only memory (ROM) or the like that stores code data for interfacing with the host. The memory controller 1110 may control the operation of the memory device 1120 to apply a first pass voltage to an unselected auxiliary word line, among a plurality of auxiliary word lines coupled to a plurality of auxiliary transistors and apply a first voltage, less than the first pass voltage, to an unselected word line, among a plurality of word lines coupled to a plurality of memory cells of the memory device 1120 while applying a program voltage or a read voltage to a selected word line, among the plurality of word lines.

The above-described memory system 1100 may be embodied as a memory card or a solid state drive (SSD) in which the memory device 1120 and the memory controller 1110 are combined with each other. For example, when the memory system 1100 is an SSD, the memory controller 1110 may communicate with an external device (e.g., host) through one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), or an integrated drive electronics (IDE).

Figure 14:
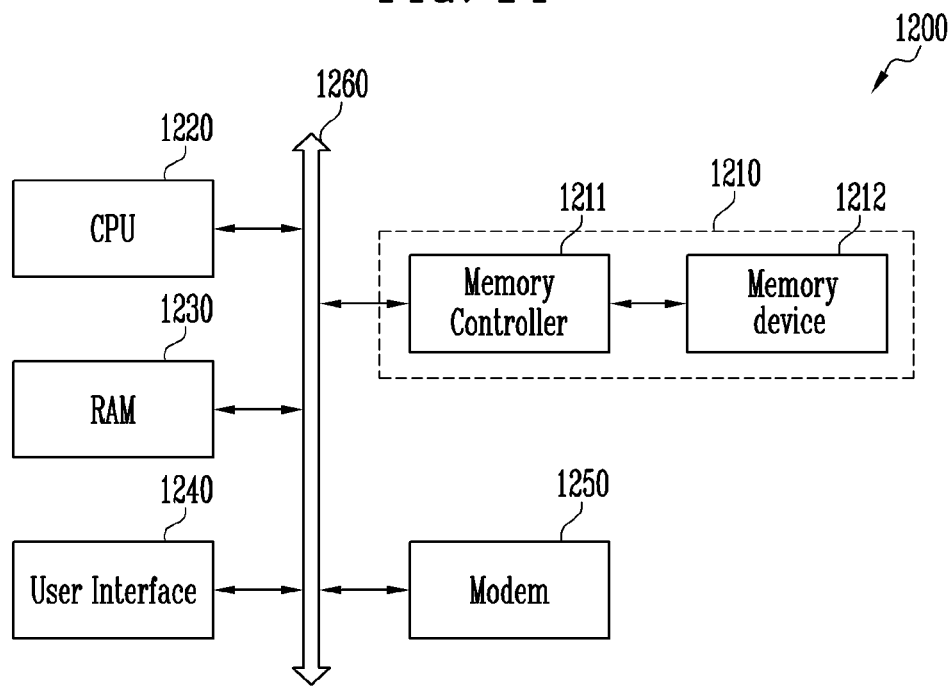
FIG. 14 is a block diagram illustrating the configuration of a computing system according to an embodiment of the present disclosure.

FIG. 14 is a block diagram illustrating the configuration of a computing system according to an embodiment of the present disclosure.

Referring to FIG. 14, a computing system 1200 may include a CPU 1220, random access memory (RAM) 1230, a user interface 1240, a modem 1250, and a memory system 1210 which are electrically coupled to a system bus 1260.

When the computing system 1200 is a mobile device, it may further include a battery for supplying an operating voltage to the computing system 1200, and may further include an application chipset, an image processor, a mobile DRAM, etc.

The memory system 1210 may include a memory device 1212 and a memory controller 1211. The memory device 1212 may have the same configuration as the memory device 1120, described above with reference to FIG. 13. The memory controller 1211 may have the same configuration as the memory controller 1110, described above with reference to FIG. 13.

In accordance with an embodiment of the present disclosure, a first side portion and a second side portion of a channel layer may be separately used as the channel of a cell string and the channel of an auxiliary string. Furthermore, the first side portion of the channel layer used as the channel of the cell string may be controlled by a plurality of word lines, and the second side portion of the channel layer used as the channel of the auxiliary string may be controlled by a plurality of auxiliary word lines.

In accordance with an embodiment of the present disclosure, during a program operation or read operation, a program operation or a read operation may be performed by applying a pass voltage to an unselected auxiliary word line.

In accordance with an embodiment of the present disclosure, during a program operation or read operation, a pass disturb phenomenon attributable to a pass voltage may be prevented or reduced by controlling the voltage to be applied to an unselected word line to be less than the pass voltage. Thus, the operational reliability of the semiconductor memory device may be improved.

According to the present disclosure, during a program operation or a read operation, semiconductor memory devices have an operational reliability, which is accomplished at least in part by controlling voltage applied to an unselected word line.

What is claimed is:

1. A semiconductor memory device, comprising:
a memory cell array comprising a cell string and an auxiliary string, which are coupled to each other through a channel layer that is coupled to a bit line, wherein the cell string comprises a plurality of memory cells stacked along a first side portion of the channel layer and wherein the auxiliary string comprises a plurality of auxiliary transistors stacked along a second side portion of the channel layer; and
a voltage supply circuit configured to apply a first pass voltage to an unselected auxiliary word line among a plurality of auxiliary word lines coupled to the plurality of auxiliary transistors and, apply a first voltage, which is less than the first pass voltage, to an unselected word line among the plurality of word lines coupled to the plurality of memory cells while applying a program voltage or a read voltage to the selected word line among the plurality of word lines.

2. The semiconductor memory device according to claim 1, wherein the unselected auxiliary word line is disposed at a substantially same level as the unselected word line.

3. The semiconductor memory device according to claim 1, wherein the voltage supply circuit is configured to apply a second voltage to a selected auxiliary word line provided at a substantially same level as the selected word line among the plurality of auxiliary word lines while applying the program voltage to the selected word line, and
wherein the second voltage is less than the first pass voltage.

4. The semiconductor memory device according to claim 3, wherein the voltage supply circuit is configured to supply a ground voltage or a positive voltage, as the second voltage, while applying the program voltage to the selected word line.

5. The semiconductor memory device according to claim 3, wherein the voltage supply circuit is configured to:
apply a second pass voltage to the selected word line before applying the program voltage to the selected word line, and
supply the second voltage as a voltage less than the second pass voltage.

6. The semiconductor memory device according to claim 3, wherein the voltage supply circuit is configured to:
apply a second pass voltage to the selected word line before applying the program voltage to the selected word line, and
supply at least one of: a ground voltage and a positive voltage less than the second pass voltage, as the first voltage, while applying the program voltage to the selected word line.

7. The semiconductor memory device according to claim 3, wherein the voltage supply circuit is configured to:
apply a second pass voltage to the selected word line before applying the program voltage to the selected word line, and
supply the first pass voltage as a voltage higher than the second pass voltage while applying the program voltage to the selected word line.

8. The semiconductor memory device according to claim 1, wherein the voltage supply circuit is configured to apply a second voltage to a selected auxiliary word line disposed at a substantially same level as the selected word line among the plurality of auxiliary word lines while applying the read voltage to the selected word line.

9. The semiconductor memory device according to claim 8, wherein the voltage supply circuit is configured to supply at least one of: a ground voltage and a negative voltage, as the second voltage, while applying the read voltage to the selected word line.

10. The semiconductor memory device according to claim 8, wherein the voltage supply circuit is configured to:
apply a second pass voltage to the selected word line before applying the read voltage to the selected word line, and
supply at least one of: a ground voltage and a positive voltage less than the second pass voltage, as the first voltage, while applying the read voltage to the selected word line.

11. The semiconductor memory device according to claim 8, wherein the voltage supply circuit is configured to:
apply a second pass voltage to the selected word line before applying the read voltage to the selected word line, and
supply the first pass voltage as a voltage higher than the second pass voltage while applying the read voltage to the selected word line.

12. A semiconductor memory device, comprising:
a channel layer comprising a first side portion and a second side portion, the first and second side portions facing different directions;
a gate stacked body enclosing the first side portion of the channel layer;
an auxiliary gate stacked body enclosing the second side portion of the channel layer; and
a data storage layer disposed between the first side portion of the channel layer and the gate stacked body, the data storage layer being formed such that the second side portion of the channel layer is opened.

13. The semiconductor memory device according to claim 12, further comprising:
- a doped semiconductor structure overlapping the gate stacked body and the auxiliary gate stacked body; and
- a bit line overlapping the doped semiconductor structure with the gate stacked body and the auxiliary gate stacked body interposed between the bit line and the doped semiconductor structure, wherein the first side portion and the second side portion of the channel layer are coupled to the bit line and the doped semiconductor structure.

14. The semiconductor memory device according to claim 13, wherein:
- the gate stacked body comprises a plurality of word lines spaced apart from each other between the doped semiconductor structure and the bit line, and
- the auxiliary gate stacked body includes a plurality of auxiliary word lines spaced apart from each other between the doped semiconductor structure and the bit line.

15. The semiconductor memory device according to claim 14, wherein the plurality of auxiliary word lines are disposed at substantially same levels as the plurality of word lines and spaced apart from the plurality of word lines.

16. The semiconductor memory device according to claim 12, further comprising:
- a tunnel insulating layer disposed between the first side portion of the channel layer and the data storage layer and extending to a space between the second side portion of the channel layer and the auxiliary gate stacked body; and
- a blocking insulating layer disposed between the data storage layer and the gate stacked body and extending to a space between the auxiliary gate stacked body and the tunnel insulating layer.

17. The semiconductor memory device according to claim 16, further comprising:
- an insulating structure disposed between the gate stacked body and the auxiliary gate stacked body and being in contact with the blocking insulating layer.

* * * * *